(12) United States Patent
Lee et al.

(10) Patent No.: US 11,374,582 B2
(45) Date of Patent: Jun. 28, 2022

(54) SEMICONDUCTOR DEVICE AND CLOCK DETECTOR

(71) Applicant: SAMSUNG ELECTRONICS CO., LTD., Suwon-si (KR)

(72) Inventors: Jeong Kwang Lee, Hwaseong-si (KR); Ho Jun Yu, Seoul (KR); Kwang Chan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/216,849

(22) Filed: Mar. 30, 2021

(65) Prior Publication Data

US 2021/0336623 A1  Oct. 28, 2021

(30) Foreign Application Priority Data

Apr. 23, 2020  (KR) .......................... 10-2020-0049363

(51) Int. Cl.
| | |
|---|---|
| *H03L 7/097* | (2006.01) |
| *H03L 7/18* | (2006.01) |
| *H03L 7/02* | (2006.01) |
| *G01R 23/00* | (2006.01) |
| *G01R 23/06* | (2006.01) |

(52) U.S. Cl.
CPC ............ *H03L 7/097* (2013.01); *G01R 23/005* (2013.01); *G01R 23/06* (2013.01); *H03L 7/02* (2013.01); *H03L 7/18* (2013.01)

(58) Field of Classification Search
CPC ...... G01R 23/00; G01R 23/005; G01R 23/02; G01R 23/06; G01R 31/31725; H03L 7/02; H03L 7/18; H03L 7/097
See application file for complete search history.

(56) References Cited

U.S. PATENT DOCUMENTS

| | | | |
|---|---|---|---|
| 6,668,334 B1 | 12/2003 | Abel et al. | |
| 6,891,401 B2 | 5/2005 | Starr et al. | |
| 2006/0063502 A1* | 3/2006 | Shibuya | ................... H03L 7/02 |
| | | | 455/76 |
| 2014/0327472 A1* | 11/2014 | Tsai | ....................... G01R 23/02 |
| | | | 327/47 |

FOREIGN PATENT DOCUMENTS

| | | | | |
|---|---|---|---|---|
| CN | 105811966 A | * | 7/2016 | ............... H03L 7/02 |
| JP | H08230651 | | 9/1996 | |

(Continued)

*Primary Examiner* — Ryan Johnson
(74) *Attorney, Agent, or Firm* — F. Chau & Associates, LLC

(57) ABSTRACT

A semiconductor device includes a clock generator which receives an input clock and generates an output clock, a reference voltage generator which receives the input clock or the output clock, generates a sub-reference voltage in accordance with a frequency of the input clock or a frequency of the output clock, and generates a reference voltage using the sub-reference voltage and a preset error voltage, and a clock detector which receives the output clock, generates a first output voltage in accordance with the output clock, and compares the generated first output voltage with the reference voltage to output an error signal based on the output clock, wherein the preset error voltage is set in accordance with a degree of preset error of the output clock.

20 Claims, 23 Drawing Sheets

(56) References Cited

FOREIGN PATENT DOCUMENTS

| | | | | |
|---|---|---|---|---|
| JP | 2005252355 | | 9/2005 | |
| JP | 3961499 | | 8/2007 | |
| JP | 5686071 | | 3/2015 | |
| JP | 2017228890 | | 12/2017 | |
| KR | 10-0847148 | | 7/2008 | |
| KR | 20100018468 A | * | 2/2010 | ............. G01R 23/06 |

* cited by examiner

SEMICONDUCTOR DEVICE AND CLOCK DETECTOR

CROSS-REFERENCE TO RELATED APPLICATION

This application claims priority under 35 U.S.C. § 119 to Korean Patent Application No. 10-2020-0049363, filed on Apr. 23, 2020 in the Korean Intellectual Property Office, the disclosure of which is incorporated by reference herein in its entirety.

TECHNICAL FIELD

Exemplary embodiments of the present inventive concept relate to a semiconductor device and a semiconductor system.

DISCUSSION OF RELATED ART

In general, phase locked loops (PLL) play an indispensable and important role in digital systems. As technology develops, a digital system may have increased operational speed and be highly integrated, so an associated PLL may also have increased operational speed. Increasing an operational speed of the system and PLL may cause problems such as Electro-Magnetic Interference (EMI). EMI may occur when the energy magnitude of a high-frequency signal exceeds a predetermined reference value, which may affect peripheral electronic circuits and cause malfunction. In particular, since semiconductor devices are sensitive to EMI, the occurrence of EMI in semiconductor integrated circuits should not be ignored.

In the automotive industry for example, as the technology develops, the number of electronic components used in automobiles is increasing. Such electronic components may include engine control units (ECU), anti-lock braking systems (ABS), stability control systems, airbag safety systems, electric power steering systems, or the like. As a result, EMI characteristics are emphasized in automobiles. For example, monitoring the operation of the PLL is implemented to increase human safety.

SUMMARY

An exemplary embodiment of the present inventive concept provides a semiconductor device capable of generating a reference voltage depending on a frequency of an input clock or an output clock and outputting an error of the output clock.

An exemplary embodiment of the present inventive concept also provides a semiconductor system capable of generating a reference voltage depending on the frequency of an input clock or an output clock and outputting an error of the output clock.

According to an exemplary embodiment of the present inventive concept, a semiconductor device includes a clock generator which is provided with an input clock and generates an output clock, a reference voltage generator which is provided with the input clock or the output clock, generates a sub-reference voltage in accordance with a frequency of the input clock or a frequency of the output clock, and generates a reference voltage, using the sub-reference voltage and a preset error voltage, and a clock detector which is provided with the output clock, generates a first output voltage in accordance with the output clock, and compares the generated first output voltage with the reference voltage to output an error signal based on the output clock, wherein the preset error voltage is set in accordance with a degree of preset error of the output clock.

According to an exemplary embodiment of the present inventive concept, a semiconductor device includes a clock generator which is provided with an input clock and generates an output clock, a divider circuit which divides the input clock or the output clock to generate a first clock, and divides the first clock to generate a second clock, a first capacitor connected to a first current source and charged with a first voltage in accordance with the second clock, a sample-and-hold circuit which samples the first voltage to output a second voltage which is an average voltage of the first voltage, a voltage regulator which generates a reference voltage having a difference between the second voltage and a preset error voltage, a second capacitor connected to a second current source and charged with a third voltage in accordance with the output clock, and a clock detector which compares the third voltage with the reference voltage to output an error signal based on the output clock.

According to an exemplary embodiment of the present inventive concept, A semiconductor system includes a semiconductor device which is provided with a reference clock and an input clock, outputs an output clock generated from the input clock using the reference clock, and outputs an error signal based on the output clock, a display circuit which is provided with the error signal and displays the error signal, control logic which is provided with the output clock and the error signal outputs the output clock when the error signal is at a first logic level, and does not output the output clock when the error signal is at a second logic level, a first function block which is provided with the output clock from the control logic and executes a first process, and a second function block which is provided with the output clock from the control logic and executes a second process different from the first process, wherein the semiconductor device includes a reference voltage generator which is provided with the input clock or the output clock, generates a sub-reference voltage in accordance with a frequency of the input clock or a frequency of the output clock, and generates a reference voltage using the sub-reference voltage and a preset error voltage, and a clock detector which is provided with the output clock, generates an output voltage in accordance with the output clock, and compares the generated output voltage with the reference voltage to output an error signal based on the output clock.

Embodiments of the present inventive concept are not restricted to the ones set forth herein. The above and other embodiments of the present inventive concept will become more apparent to those of ordinary skill in the art to which the present inventive concept pertains by referencing the detailed description of the present inventive concept given below.

BRIEF DESCRIPTION OF THE DRAWINGS

The above and other embodiments of the present inventive concept will become more apparent by describing in detail exemplary embodiments thereof with reference to the attached drawings, in which.

DETAILED DESCRIPTION

Figure 1:
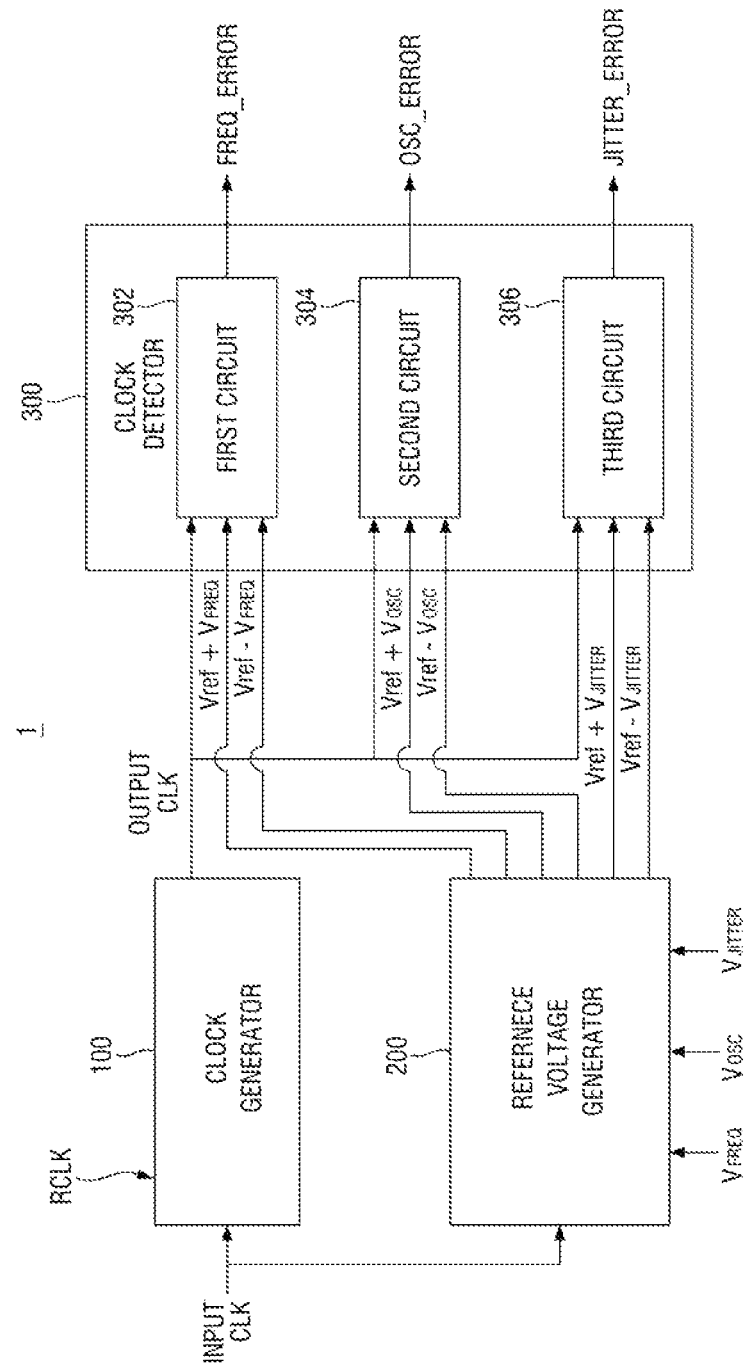
FIG. 1 is a block diagram for explaining a semiconductor device according to an exemplary embodiment of the present inventive concept.
Figure 2:
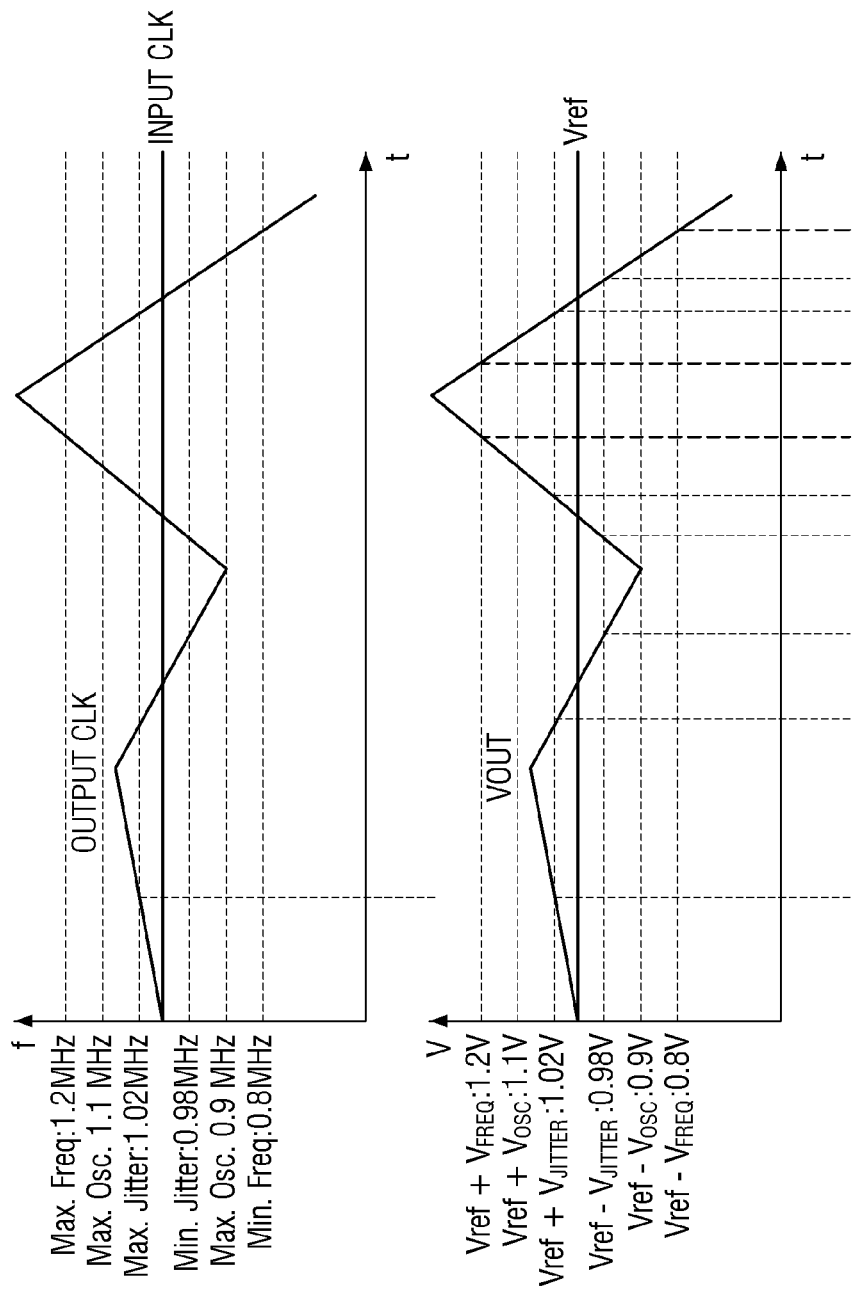
FIG. 2 is a graphical diagram for explaining a reference voltage of FIG. 1.

FIG. 1 is a block diagram for explaining a semiconductor device according to an exemplary embodiment of the present inventive concept. FIG. 2 is a diagram for explaining a reference voltage of FIG. 1.

Referring to FIG. 1, the semiconductor device 1 according to an exemplary embodiment of the present inventive concept may include a clock generator 100, a reference voltage generator 200, and a clock detector 300.

The clock generator 100 may be provided with an input clock INPUT CLK and generate an output clock OUTPUT CLK. The output clock OUTPUT CLK may be a system clock required for operating the semiconductor system in a semiconductor system including the semiconductor device according to an exemplary embodiment of the present inventive concept.

The clock generator 100 may be, for example, a Phase Locked Loop (PLL) which is provided with a reference clock RCLK, and generates an output clock OUTPUT CLK from the input clock INPUT CLK using the reference clock RCLK.

The reference voltage generator 200 may be provided with an input clock INPUT and a plurality of error voltages ($V_{FREQ}$, $V_{OSC}$, and $V_{JITTER}$). The plurality of error voltages ($V_{FREQ}$, $V_{OSC}$, and $V_{JITTER}$) may be values which are set in advance, depending on a preset degree of error of the output clock OUTPUT CLK. The plurality of error voltages ($V_{FREQ}$, $V_{OSC}$, and $V_{JITTER}$) may be voltages obtained by converting a preset degree of error in accordance with a conversion ratio of a voltage in contrast to a frequency.

For example, the plurality of error voltages ($V_{FREQ}$, $V_{OSC}$, and $V_{JITTER}$) may include a first error voltage $V_{FREQ}$, a second error voltage $V_{OSC}$ and a third error voltage $V_{JITTER}$. The first error voltage $V_{FREQ}$ may be an error voltage indicating a normal range of the frequency of the output clock OUTPUT CLK. The second error voltage $V_{OSC}$ may be an error voltage indicating a normal range of oscillation of the output clock OUTPUT CLK. The third error voltage $V_{JITTER}$ may be an error voltage indicating a normal range of jitter of the output clock OUTPUT CLK. This will be described in detail with reference to FIG. 2.

The PLL may include, for example, a phase frequency detector, a charge pump, a loop filter, and a Voltage Controlled Oscillator (VCO). Noise due to jitter or oscillation may be one of the indexes that determine the performance of the PLL.

A graph at the top of FIG. 2 shows the frequency of the input clock INPUT CLK and the output clock OUTPUT CLK versus time. The graph at the bottom of FIG. 2 is a graph in which the frequencies of the input clock INPUT CLK and the output clock OUTPUT CLK, over the same time of the graph in the top of FIG. 2, are converted into the corresponding voltages versus time. Here, for ease of description, it is assumed that the frequency of the input clock INPUT CLK is 1 MHz and the conversion rate of voltage in contrast to frequency is 1 MHz/V, without limitation thereto.

The normal range of the frequency at which the frequency of the output clock OUTPUT CLK may be determined to be normal may be set within about 20% of the frequency of the input clock INPUT CLK, for example. That is, the preset degree of error may be 0.2 MHz. If the frequency of the output clock OUTPUT CLK is between about 0.8 MHz or more and 1.2 MHz or less, the frequency of the output clock OUTPUT CLK may be considered to be normal. If the frequency of the output clock OUTPUT CLK is less than 0.8 MHz or exceeds 1.2 MHz, a frequency error may be considered to occur in the output clock OUTPUT CLK, and the operation of the clock generator 100 may be considered to be abnormal.

A voltage Vref of the input clock INPUT CLK may be converted into 1 V according to the conversion rate of voltage in contrast to frequency. The first error voltage $V_{FREQ}$ indicating the error of the frequency of the output clock OUTPUT CLK may be 0.2 V obtained by converting a preset degree of error of 0.2 MHz according to the conversion rate of voltage in contrast to frequency. Therefore, the normal range of the voltage sum for frequency of the output clock OUTPUT CLK may be between about 0.8

V or more and 1.2 V or less. That is, a first reference voltage (Vref+$V_{FREQ}$) may be 1.2 V, and a second reference voltage (Vref−$V_{FREQ}$) may be 0.8 V.

The normal range of the jitter in which the jitter of the output clock OUTPUT CLK may be determined to be normal may be set to about 2% of the frequency of the input clock INPUT CLK. That is, the preset degree of error may be 0.02 MHz. When the frequency of the output clock OUTPUT CLK is between about 0.98 MHz or more and 1.02 MHz or less, the jitter of the output clock OUTPUT CLK may be considered to be normal. When the jitter of the output clock OUTPUT CLK is less than 0.98 MHz or exceeds 1.02 MHz, the output clock OUTPUT CLK may be considered to be beyond an allowable range of jitter, the jitter of the output clock OUTPUT CLK may be considered to be abnormal, and the operation of the clock generator 100 may be considered to be abnormal.

The third error voltage $V_{JITTER}$ indicating the error of the jitter of the output clock OUTPUT CLK may be 0.02 V obtained by converting the preset degree of error of 0.02 MHz according to the conversion rate of voltage in contrast to frequency. The voltage sum for the normal range of jitter of the output clock OUTPUT CLK may be 1.02 V or more and 0.98 V or less. A third reference voltage (Vref+$V_{JITTER}$) may be 1.02 V and a fourth reference voltage (Vref−$V_{JITTER}$) may be 0.98 V.

A normal range of oscillation in which oscillation of the output clock OUTPUT CLK may be determined to be normal may be set to about 10% of the frequency of the input clock INPUT CLK. That is, the preset degree of error may be 0.1 MHz. When the frequency of the output clock OUTPUT CLK is between about 0.9 MHz or more and 1.1 MHz or less, the oscillation of the output clock OUTPUT CLK may be considered to be normal. When the oscillation of the output clock OUTPUT CLK is less than 0.9 MHz or exceeds 1.1 MHz, the output clock OUTPUT CLK may be considered to be beyond the allowable range of oscillation. Therefore, the oscillation of the output clock OUTPUT CLK may be considered to be abnormal, and the operation of the clock generator 100 may be considered to be abnormal.

The second error voltage $V_{OSC}$, which indicates an error of oscillation of the output clock OUTPUT CLK, may be 0.1V obtained by converting a preset degree of error of 0.1 MHz according to the conversion rate of voltage in contrast to frequency. The voltage sum for the normal range of oscillation of the output clock OUTPUT CLK may be 1.1 V or more and 0.9 V or less. A fifth reference voltage (Vref+$V_{OSC}$) may be 1.1 V, and a sixth reference voltage (Vref−$V_{OSC}$) may be 0.9 V.

Referring again to FIG. 1, the reference voltage generator 200 may generate a sub-reference voltage Vref to be described later, according to the frequency of the input clock INPUT CLK. The reference voltage generator 200 may generate a plurality of reference voltages, using the sub-reference voltage Vref and a plurality of error voltages ($V_{FREQ}$, $V_{OSC}$, and $V_{JITTER}$).

The plurality of reference voltages may include, for example, first to sixth reference voltages (Vref±$V_{FREQ}$, Vref±$V_{OSC}$, and Vref±$V_{JITTER}$). The first and second reference voltages (Vref±$V_{FREQ}$) may be voltages generated using the sub-reference voltage Vref and the first error voltage $V_{FREQ}$. The first reference voltage (Vref+$V_{FREQ}$) may be a voltage obtained by sum of the sub-reference voltage Vref and the first error voltage $V_{FREQ}$. The second reference voltage (Vref−$V_{FREQ}$) may be a voltage obtained by subtracting the first error voltage $V_{FREQ}$ from the sub-reference voltage Vref. That is, the first reference voltage (Vref+$V_{FREQ}$) may be an upper limit value that indicates the normal range of the frequency of the output clock OUTPUT CLK, and the second reference voltage (Vref−$V_{FREQ}$) may be a lower limit value that indicates the normal range of frequency of the output clock OUTPUT CLK.

The third and fourth reference voltages (Vref±$V_{OSC}$) may be voltages generated using the sub-reference voltage Vref and the second error voltage $V_{OSC}$. The third reference voltage (Vref+$V_{OSC}$) may be a voltage sum of the sub-reference voltage Vref and the second error voltage $V_{OSC}$. The fourth reference voltage (Vref−$V_{OSC}$) may be a voltage obtained by subtracting the second error voltage $V_{OSC}$ from the sub-reference voltage Vref. That is, the third reference voltage (Vref+$V_{OSC}$) may be an upper limit value that indicates the normal range of oscillation of the output clock OUTPUT CLK, and the fourth reference voltage (Vref−$V_{OSC}$) may be a lower limit value that indicates the normal range of oscillation of the output clock OUTPUTCLK.

The fifth and sixth reference voltages (Vref±$V_{JITTER}$) may be voltages generated using the sub-reference voltage Vref and the third error voltage $V_{JITTER}$. The fifth reference voltage (Vref+$V_{JITTER}$) may be a voltage sum of the sub-reference voltage Vref and the third error voltage $V_{JITTER}$. The sixth reference voltage (Vref−$V_{JITTER}$) may be a voltage obtained by subtracting the third error voltage $V_{JITTER}$ from the sub-reference voltage Vref. That is, the fifth reference voltage (Vref+$V_{JITTER}$) may be an upper limit value that indicates the normal range of jitter of the output clock OUTPUT CLK, and the sixth reference voltage (Vref−$V_{JITTER}$) may be a lower limit value that indicates the normal range of the jitter of the output clock OUTPUT CLK.

The clock detector 300 may be provided with the output clock OUTPUT CLK from the clock generator 100, and a plurality of reference voltages (Vref±$V_{FREQ}$, Vref $V_{OSC}$, and Vref±$V_{JITTER}$) from the reference voltage generator 200. The clock detector 300 may output a plurality of error signals (FREQ_ERROR, OSC_ERROR, and JITTER_ERROR) that indicates errors of the output clock OUTPUT CLK, using the output clock OUTPUT CLK and a plurality of reference voltages (Vref±$V_{FREQ}$, Vref $V_{OSC}$, and Vref±$V_{JITTER}$). The clock detector 300 may generate an output voltage according to the output clock OUTPUT CLK, and may compare the output voltage with the plurality of reference voltages (Vref±$V_{FREQ}$, Vref±$V_{OSC}$, and Vref±$V_{JITTER}$) to output the plurality of error signals (FREQ_ERROR, OSC_ERROR, and JITTER_ERROR).

The clock detector 300 may include first to third circuits 302, 304 and 306. The first circuit 302 is provided with the output clock OUTPUT CLK and the first and second reference voltages (Vref±$V_{FREQ}$), and may output a first error signal FREQ_ERROR indicating a frequency error of the output clock OUTPUT CLK. The second circuit 304 is provided with the output clock OUTPUT CLK and the third and fourth reference voltages (Vref±$V_{OSC}$), and may output a second error signal OSC_ERROR indicating an oscillation error of the output clock OUTPUT CLK. The third circuit 306 is provided with the output clock OUTPUT CLK and the fifth and sixth reference voltages (Vref±$V_{JITTER}$), and may output a third error signal JITTER_ERROR indicating a jitter error of the output clock OUTPUT CLK.

The semiconductor device 1 according to an exemplary embodiment of the present inventive concept may detect an error of the frequency of the output clock OUTPUT CLK that is output from the clock generator 100, and may determine whether there is an error of jitter or an error of oscillation. Therefore, the semiconductor device 1 according to an exemplary embodiment of the present inventive concept may accurately detect an error of the output clock OUTPUT CLK.

Figure 3:
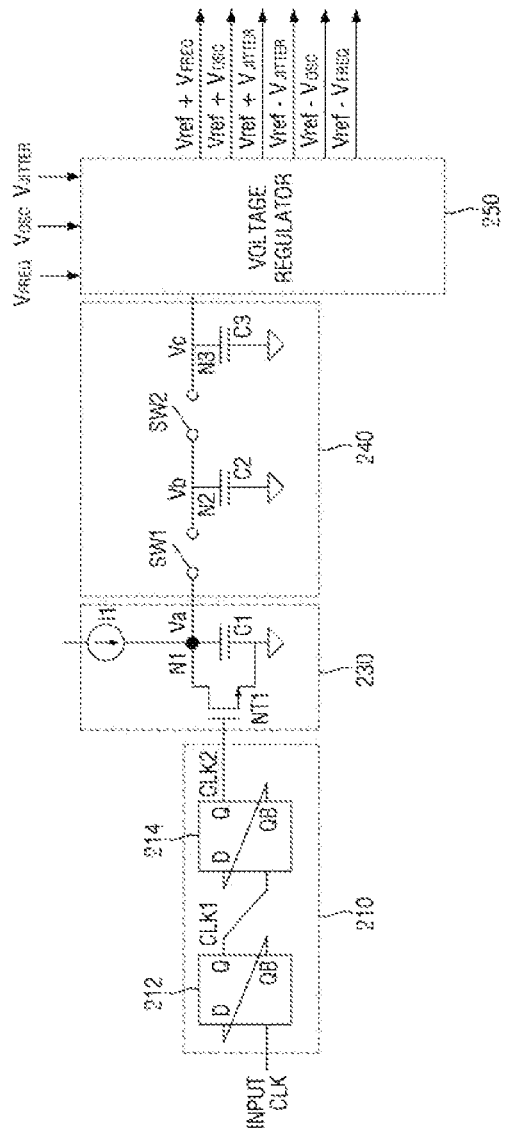
FIG. 3 is a block diagram for explaining a reference voltage generator according to an exemplary embodiment of the present inventive concept of FIG. 1.
Figure 4:
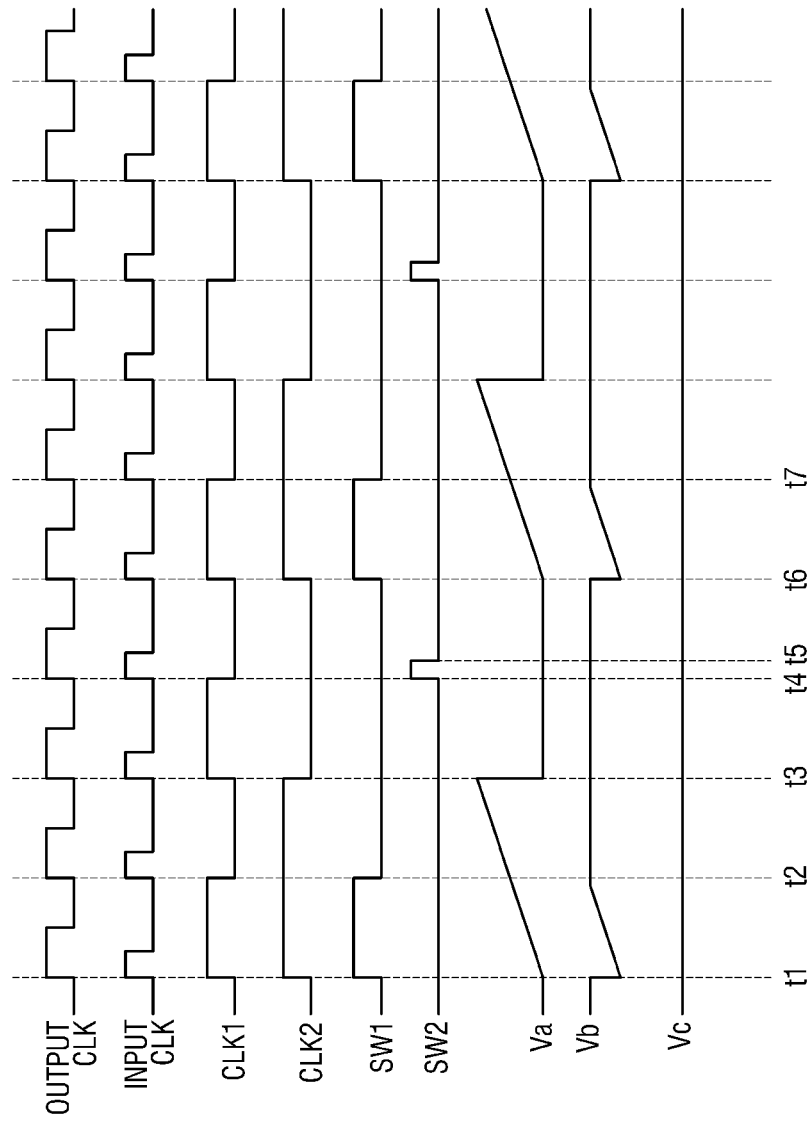
FIG. 4 is a timing diagram for explaining the reference voltage generator of FIGS. 3 and 17.

FIG. 3 is a block diagram for explaining a reference voltage generator according to an exemplary embodiment of the present inventive concept of FIG. 1. FIG. 4 is a timing diagram for explaining the operation of the reference voltage generator of FIG. 3.

Referring to FIGS. 3 and 4, a reference voltage generator 200-1 may be provided with the input clock INPUT CLK to generate a plurality of error voltages ($V_{FREQ}$, $V_{OSC}$, and $V_{JITTER}$). The reference voltage generator 200-1 may include a divider circuit 210, a voltage conversion circuit 230, a sample-and-hold circuit 240, and a voltage regulator 250.

The divider circuit 210 may divide the input clock INPUT CLK by 2 to generate the first clock CLK1, and may divide the first clock CLK1 by 2 to generate the second clock CLK2. The divider circuit 210 may include a first flip-flop 212 and a second flip-flop 214. The first flip-flop 212 and the second flip-flop 214 may each be implemented as a D flip-flop.

The first flip-flop 212 may respond to a rising edge of the input clock INPUT CLK to output, for example, a first clock CLK1 having a first logic level at a first time point t1, a third time point t3, and a sixth time point t6. The first flip-flop 212 may respond to the rising edge of the input clock INPUT CLK to output, for example, a first clock CLK1 having a second logic level at the second time point t2, the third time point t3, and the seventh time point t7. Hereinafter, the first logic level may mean a high level, and the second logic level may mean a low level. The frequency of the first clock CLK1 may be 0.5 times the frequency of the input clock INPUT CLK.

The second flip-flop 214 may respond to the rising edge of the first clock CLK1 to output, for example, the second clock CLK2 having the first logic level at the first time point t1 and the sixth time point t6. The second flip-flop 214 may respond to the rising edge of the first clock CLK1 to output, for example, the second clock CLK2 having the first logic level at the second time point t2. The frequency of the second clock CLK2 may be 0.5 times the frequency of the first clock CLK1, and may be 0.25 times the frequency of the input clock INPUT CLK.

In an alternate embodiment, the first and second flip-flops may each be implemented as edge-triggered dynamic D storage elements, such as, for example, a complementary metal-oxide semiconductor (CMOS) integrated circuit (IC) implementation of a dynamic edge-triggered flip-flop with reset. Each edge-triggered dynamic D storage element may provide an efficient functional alternative to a D flip-flop by using dynamic circuits where information is stored in a capacitance, and/or where a master-slave D element is triggered on the edge of a clock while its components are triggered by clock levels.

The voltage conversion circuit 230 may be provided with the second clock CLK2 from the divider circuit 210 and may provide the voltage Va of the first node N1 to the sample-and-hold circuit 240. The voltage conversion circuit 230 may include a first transistor NT1, a first current source I1, and a first capacitor C1.

The first current source I1 may output a constant current to the first node Va.

The first transistor NT1 is gated to the second clock CLK2 and may be connected between the first node Va and the ground node. The first transistor NT1 is turned on when the second clock CLK2 is at the first logic level, and may provide the ground voltage to the first node Va. That is, the voltage Va of the first node N1 may be reset by the second clock CLK2. The first transistor NT1 may be turned off when the second clock CLK2 is at the second logic level. The first transistor NT1 may be, for example, an N-type transistor.

The first capacitor C1 may be connected between the first node Va and the ground node. The first capacitor C1 may be connected in parallel with the first transistor NT1. The first capacitor C1 is provided with a current from the first current source I1 when the first transistor NT1 is turned on, and may be charged with the voltage Va of the first node N1. The first capacitor C1 may be discharged by the ground voltage when the first transistor NT1 is turned off.

The voltage Va of the first node N1 may be a voltage integrated by the first capacitor C1. Therefore, the voltage Va of the first node N1 may increase, in a section in which the second clock CLK2 is at the first logic level, for example, between the first time point t1 and the third time point t3. That is, the voltage Va of the first node N1 may be a voltage generated by the first capacitor C1 during a half or 0.5 cycles of the second clock CLK2, that is, during 2 cycles of the input clock INPUT CLK. Therefore, the voltage Va of the first node N1 may be determined depending on the frequency of the input clock INPUT CLK.

The sample-and-hold circuit 240 is provided with the voltage Va of the first node N1 and may transfer the voltage to the third node N3. The sample-and-hold circuit 240 may include a first switch SW1, a second capacitor C2, a second switch SW2, and a third capacitor C3. The capacitances of the second and third capacitors C2 and C3 may be substantially the same as the capacitance of the first capacitor C1.

The first switch SW1 may be connected between the first node Va and the second node N2. The second capacitor C2 may be connected between the second node N2 and the ground node. When the first switch SW1 is turned on, the second node N2 may be provided with the voltage from the first node Va, and the second capacitor C2 may be charged with a voltage Vb of the second node N2. When the first switch SW1 is turned off, the voltage Vb of the second node N2 may be held by the second capacitor C2.

The first switch SW1 may be turned on when both the first clock CLK1 and the second clock CLK2 are at the first logic level. Therefore, the second node N2 may be provided with, for example, substantially the same voltage as the voltage Va of the first node N1 at the first time point t1 and the second time point t2, and may be maintained at the sub-reference voltage Vref by the second capacitor C2 at the second time point t2.

Here, the sub-reference voltage Vref may be a voltage generated by the first capacitor C1 between the first time point t1 and the second time point t2. The sub-reference voltage Vref may be a voltage generated by the first capacitor C1 during 1 cycle of the input clock INPUT CLK. Therefore, the sub-reference voltage Vref may be generated depending on the frequency of the input clock INPUT CLK.

Also, the time between the first time point t1 and the second time point t2 may be substantially the same as the time between the second time point t2 and the third time point t3. That is, the sub-reference voltage Vref may be an average value of the voltages generated by the first capacitor C1 between the first time point t1 and the third time point t3.

The second switch SW2 may be connected between the second node N2 and the third node N3. The third capacitor C3 may be connected between the third node N3 and the ground node. When the second switch SW2 is turned on, the third node N3 may be provided with the voltage from the second node N2, and the third capacitor C3 may be charged with a voltage Vc of the third node N3. When the second switch SW2 is turned off, the voltage Vc of the third node N3 may be held by the third capacitor C3.

When the voltage Vb of the second node N2 has a constant voltage, the second switch SW2 may be turned on, for example, between the fourth time point t4 and the fifth time point t5. Therefore, the third node N3 may be provided with a stabilized sub-reference voltage Vref and may be maintained at the sub-reference voltage Vref by the third capacitor C3. The present inventive concept is not limited thereto, and the second switch SW2 may be turned on at an arbitrary time point when the voltage of the second node N2 between the second time point t2 and the sixth time point t6 is stabilized.

That is, the sample-and-hold circuit 240 first samples the voltage Va of the first node N1 between the first time point t1 and the second time point t2, and may provide the sampled voltage to the second node N2. In addition, the sample-and-hold circuit 240 second samples the voltage Vb of the second node N2 between the fourth time point t4 and the fifth time point t5, and may provide the sampled voltage to the third node N3. Therefore, the sample-and-hold circuit 240 may output the stabilized sub-reference voltage Vref.

The voltage regulator 250 may be connected to the third node N3 and be provided with the sub-reference voltage Vref. In addition, the voltage regulator 250 may be provided with the first to third error voltages ($V_{FREQ}$, $V_{OSC}$, and $V_{JITTER}$). The voltage regulator 250 is provided with the sub-reference voltage Vref and the first to third error voltages ($V_{FREQ}$, $V_{OSC}$, and $V_{JITTER}$), and may generate the first to sixth reference voltages (Vref±$V_{FREQ}$, Vref±$V_{OSC}$, and Vref±$V_{JITTER}$).

A reference voltage generator 200-1 according to an exemplary embodiment of the present inventive concept may generate a sub-reference voltage Vref and a plurality of reference voltages (Vref±$V_{FREQ}$, Vref±$V_{OSC}$, and Vref±$V_{JITTER}$) depending on the frequency of the input clock INPUT CLK. Therefore, the semiconductor device 1 according to an exemplary embodiment of the present inventive concept can operate normally even if the frequency of the input clock INPUT CLK is changed.

Figure 5:
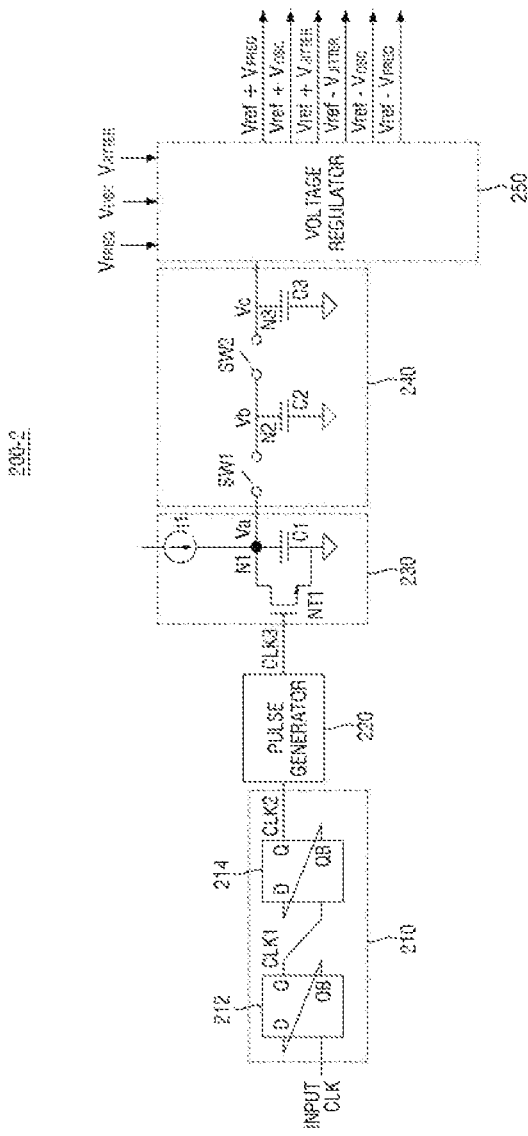
FIG. 5 is a block diagram for explaining the reference voltage generator according to an exemplary embodiment of the present inventive concept of FIG. 1.
Figure 6:
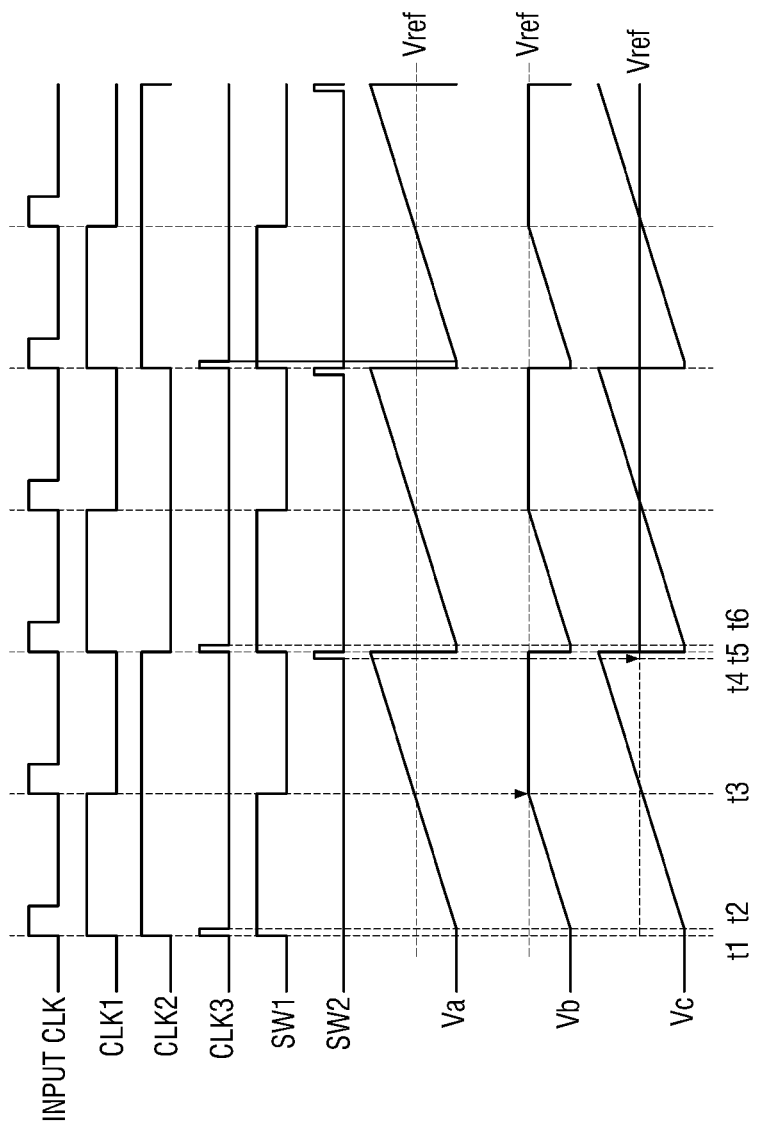
FIG. 6 is a timing diagram for explaining the operation of the reference voltage generator of FIG. 5.

FIG. 5 is a block diagram for explaining the reference voltage generator according to an exemplary embodiment of the present inventive concept of FIG. 1. FIG. 6 is a timing diagram for explaining the operation of the reference voltage generator of FIG. 5. Points different from those of FIGS. 3 and 4 will be mainly explained, and substantially duplicate description may be omitted.

Referring to FIGS. 5 and 6, a reference voltage generator 200-2 is provided with an input clock INPUT CLK and may generate a plurality of error voltages ($V_{FREQ}$, $V_{OSC}$, and $V_{JITTER}$) The reference voltage generator 200-2 may include a divider circuit 210, a pulse generator 220, a voltage conversion circuit 230, a sample-and-hold circuit 240, and a voltage regulator 250.

The pulse generator 220 may be connected between the divider circuit 210 and the voltage conversion circuit 230. The pulse generator 220 may be provided with a second clock CLK2 from the divider circuit 210 to generate a third clock CLK3.

The pulse generator 220 may generate a pulse in response to a rising edge and a falling edge of the second clock CLK2, and may output the pulse to the third clock CLK3. That is, the pulse generator 220 may generate pulses at the first time point t1 and the fifth time point t5. The third clock CLK3 has the first logic level at the first time point t1 and the fifth time point t5, and has the second logic level at the second time point t2 and the sixth time point t6.

The voltage conversion circuit 230 is provided with the third clock CLK3 from the pulse generator 220, and may provide the voltage Va of the first node N1 to the sample-and-hold circuit 240.

The first transistor NT1 is gated to the third clock CLK3 and may be connected between the first node N1 and the ground node. The first transistor NT1 is turned on when the third clock CLK3 is at the first logic level, and may provide the ground voltage to the first node N1. That is, the voltage Va of the first node N1 may be reset by the third clock CLK3. The first transistor NT1 may be turned off when the third clock CLK3 is at the second logic level. The first transistor NT1 may be, for example, an N-type transistor.

The sample-and-hold circuit 240 is provided with the voltage Va of the first node N1 and may transfer the voltage to the third node N3.

The first switch SW1 may be controlled by the first clock CLK1. The first switch SW1 may be turned on when the first clock CLK1 is at the first logic level, and the first switch SW1 may be turned off when the first clock CLK1 is at the second logic level. Therefore, the second node N2 may be provided with the voltage from the first node N1 between the first time point t1 and the second time point t2.

The second switch SW2 may be controlled by the pulses generated before the rising edge and the falling edge of the third clock CLK3. The pulses may be generated from the pulse generator 220, or may be generated from another pulse generator (not shown). Alternatively, the second switch SW2 may be turned on an arbitrary time point when the voltage of the node of the second node N2 is stable, between the third time point t3 and the fifth time point t5.

Here, the pulse width of the third clock CLK3 may be very small. Therefore, the third node N3 may be provided with the sub-reference voltage Vref.

Therefore, since the reference voltage generator 200-2 according to an exemplary embodiment of the present inventive concept generates the sub-reference voltage Vref for each cycle of the first clock CLK1, it is possible to generate the sub-reference voltage Vref to be more sensitive to changes in the frequency of the input clock INPUT CLK. Also, the semiconductor device 1 according to an exemplary embodiment of the present inventive concept may more quickly detect an error of the output clock OUTPUT CLK.

The voltage regulator 250 is provided with the sub-reference voltage Vref and the first to third error voltages ($V_{FREQ}$, $V_{OSC}$, and $V_{JITTER}$), and may generate the first to sixth reference voltages (Vref±$V_{FREQ}$, Vref±$V_{OSC}$, and Vref±$V_{JITTER}$).

Figure 7:
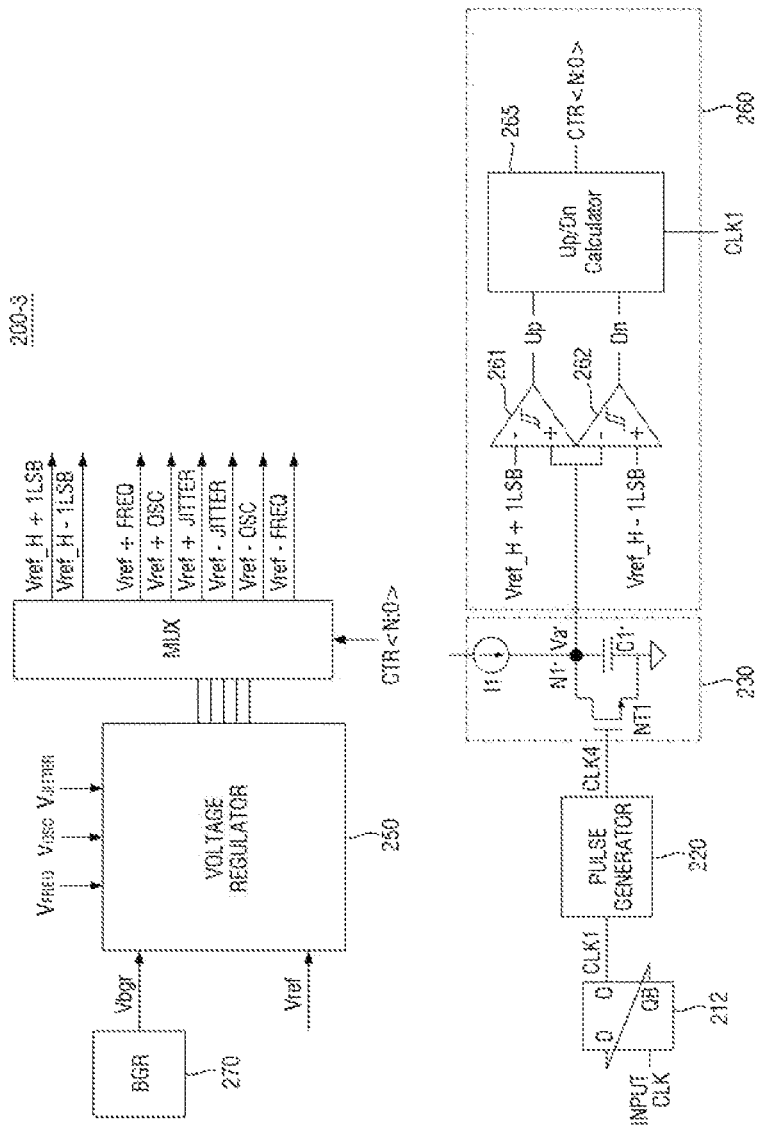
FIG. 7 is a block diagram for explaining the reference voltage generator according to an exemplary embodiment of the present inventive concept of FIG. 1.
Figure 8:
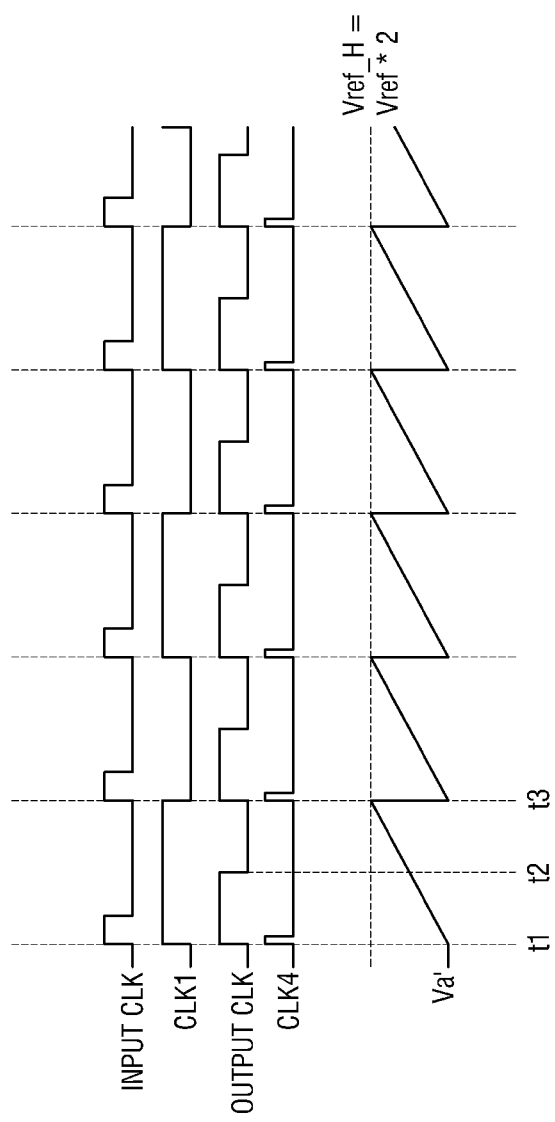
FIG. 8 is a timing diagram for explaining the operation of the reference voltage generator of FIGS. 7 and 19.

FIG. 7 is a block diagram for explaining a reference voltage generator according to an exemplary embodiment of the present inventive concept of FIG. 1. FIG. 8 is a timing diagram for explaining the operation of the reference voltage generator of FIG. 7. Points different from FIGS. 3 and 5 will be mainly explained, and substantially duplicate description may be omitted.

Referring to FIGS. 7 and 8, a reference voltage generator 200-3 includes a first flip-flop 212, a pulse generator 220, a voltage conversion circuit 230, a voltage regulator 250, and a control signal generation circuit 260, a bandgap reference voltage generation circuit 270, and a multiplexer MUX.

The first flip-flop 212 may divide the input clock INPUT CLK by 2 to generate a first clock CLK1.

The pulse generator 220 may generate a pulse in response to the rising edge and the falling edge of the first clock CLK1 and output the pulse to the fourth clock CLK4. That is, the pulse generator 220 may generate pulses at the first time point t1 and the third time point t3.

The voltage conversion circuit 230 is provided with the fourth clock CLK4 from the pulse generator 220 and may provide the voltage Va' of a first node N1' to the control signal generation circuit 260.

The first transistor NT1 is gated to the fourth clock CLK4 and may be connected between the first node N1' and the ground node. The first transistor NT1 is turned on when the second clock CLK2 is at the first logic level, and may provide the ground voltage to the first node N1'. That is, the voltage Va' of the first node N1' may be reset by the fourth clock CLK4.

A first capacitor C1' may be connected between the first node N1' and the ground node. The first capacitor C1' is provided with the current from the first current source I1 when the first transistor NT1 is turned on, and may be charged with the voltage Va' of the first node N1'. The first capacitor C1' may be discharged by the ground voltage when the first transistor NT1 is turned off.

The capacitance of the first capacitor C1' may be 0.5 times the capacitance of the first to third capacitors C1, C2 and C3 of FIGS. 3 and 5. Therefore, the first capacitor C1' may be charged with a second sub-reference voltage Vref_H that is twice the sub-reference voltage Vref of FIGS. 4 and 6 at the third time point t3.

A first comparator 261 may generate an up signal UP by comparing the voltage Va' of the first node N1' with a first control voltage (Verf_H+1LSB). A second comparator 262 may generate a down signal DN by comparing the voltage Va' of the first node N1' with a second control voltage (Vref_H−1LSB). A up/down calculator 265 is enabled according to the first clock CLK1, and may output a control signal CTR<N:0> on the basis of the up signal UP and the down signal DN. The control signal CTR<N:0> may be an N-bit digital signal.

On the other hand, the bandgap reference voltage generation circuit 270 may generate a bandgap reference voltage Vbgr to be provided to other electric elements. The bandgap reference voltage generation circuit 270 may be a circuit for supplying a reference voltage or a reference current of a constant level which is not affected by the fluctuation of the power supply voltage, the temperature change, and the process variation due to the output characteristics in which a negative (−) temperature coefficient and a positive (+) temperature coefficient are offset each other. The bandgap reference voltage generation circuit 270 may be implemented to be integrated in an integrated circuit together with other electric elements.

The voltage regulator 250 is provided with the bandgap reference voltage Vbgr and the first to third error voltages ($V_{FREQ}$, $V_{OSC}$, and $V_{JITTER}$), and may generate an output voltage. The voltage regulator 250 may include N resistors connected in series. The multiplexer MUX may include N connection lines connected to respective nodes between adjacent resistors of the N resistors. A difference 1LSB between the first control voltage (Verf_H+1LSB) and the second sub-reference voltage Vref_H described above may indicate a voltage difference in nodes connected to the adjacent connection lines.

The multiplexer MUX may or may not be connected to the N connection lines by the control signal CTR<N:0>. The multiplexer MUX may output the first to sixth reference voltages (Vref±$V_{FREQ}$, Vref±$V_{OSC}$, and Vref±$V_{JITTER}$) according to the output voltage of the voltage regulator 250 and the resistor connected by the connection line.

Figure 9:
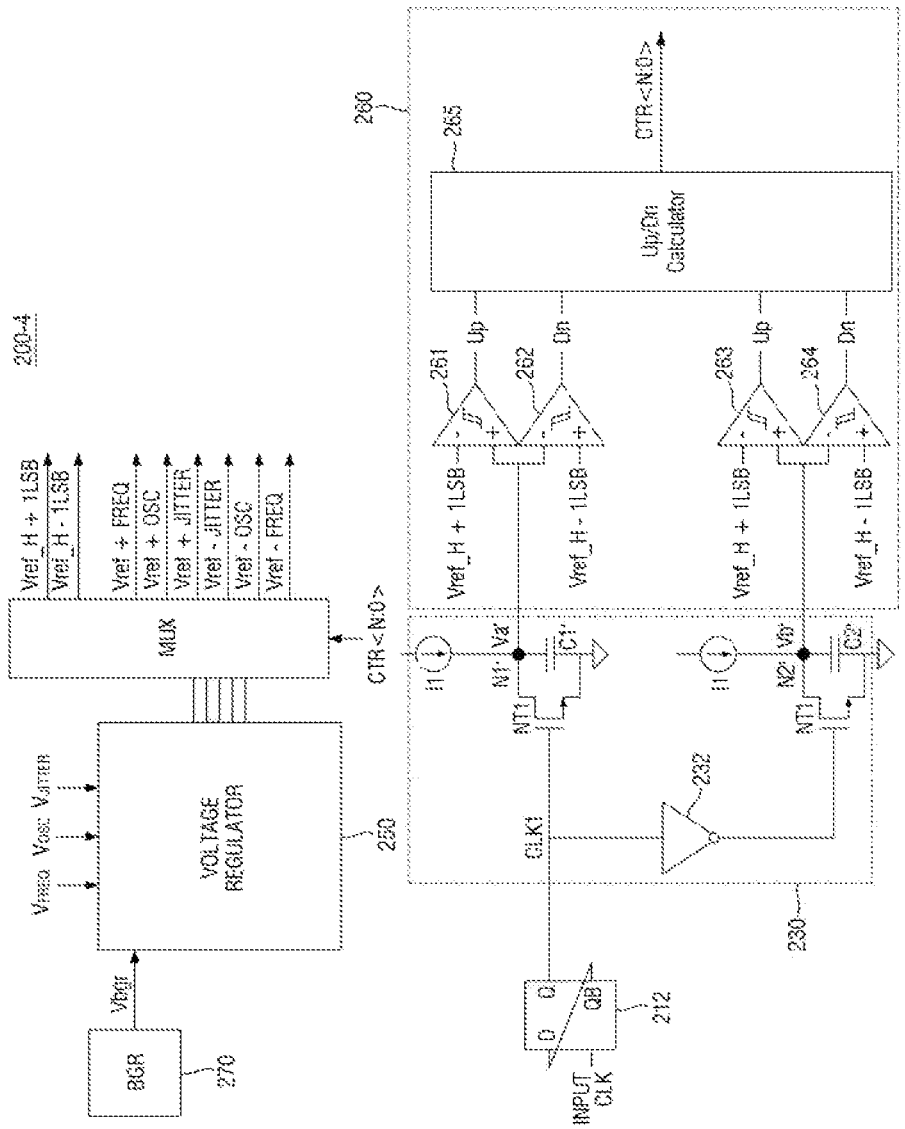
FIG. 9 is a block diagram for explaining the reference voltage generator according to an exemplary embodiment of the present inventive concept of FIG. 1.
Figure 10:
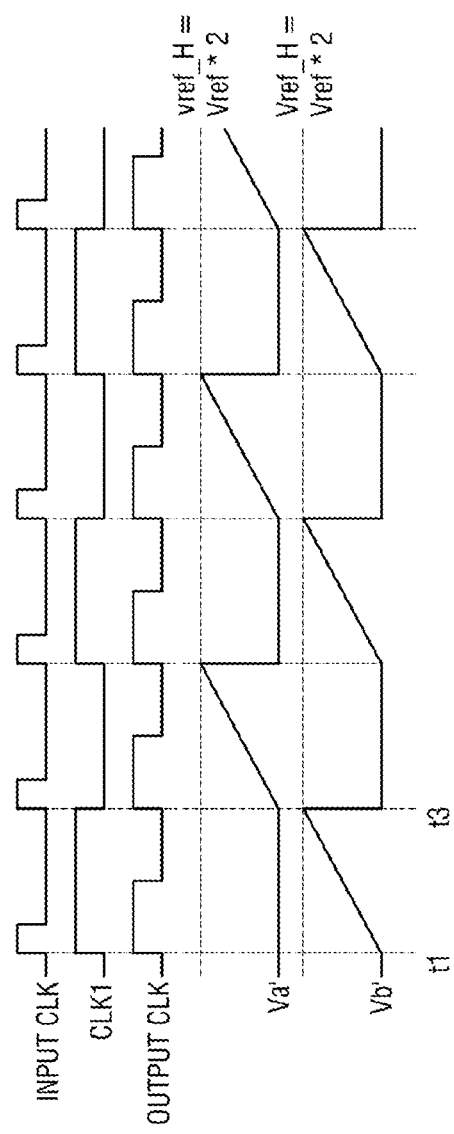
FIG. 10 is a timing diagram for explaining the operation of the reference voltage generator of FIGS. 9 and 19.

FIG. 9 is a block diagram for explaining a reference voltage generator according to an exemplary embodiment of the present inventive concept of FIG. 1. FIG. 10 is a timing diagram for explaining the operation of the reference voltage generator of FIG. 9. Points different from FIGS. 7 and 8 will be mainly explained, and substantially duplicate description may be omitted.

Referring to FIG. 9, a reference voltage generator 200-4 includes a first flip-flop 212, a voltage conversion circuit 230, a control signal generation circuit 260, a bandgap reference voltage generation circuit 270, and a multiplexer MUX.

The voltage conversion circuit 230 is provided with the fourth clock CLK4 from the pulse generator 220, and may provide the voltage Va' of the first node N1' to the control signal generation circuit 260. Further, the voltage conversion circuit 230 may invert the fourth clock CLK1 and provide the voltage Vb' of the second node N2' to the control signal generation circuit 260.

A first comparator 261 may generate an up signal UP by comparing the voltage Va' of the first node N1' with the first control voltage (Verf_H+1LSB). A second comparator 262 may generate a down signal DN by comparing the voltage Va' of the first node N1' with the second control voltage (Vref_H−1LSB). A third comparator 263 may generate an up signal UP by comparing the voltage Vb' of the second node N2' with the first control voltage (Verf_H+1LSB). The fourth comparator 264 may generate a down signal DN by comparing the voltage Vb' of the second node N2' with the second control voltage (Vref_H−1LSB). A up/down calculator 265 is enabled according to the first clock CLK1 and may output a control signal CTR<N:0> on the basis of the up signal UP and the down signal DN. The control signal CTR<N:0> may be an N-bit digital signal.

Figure 11:
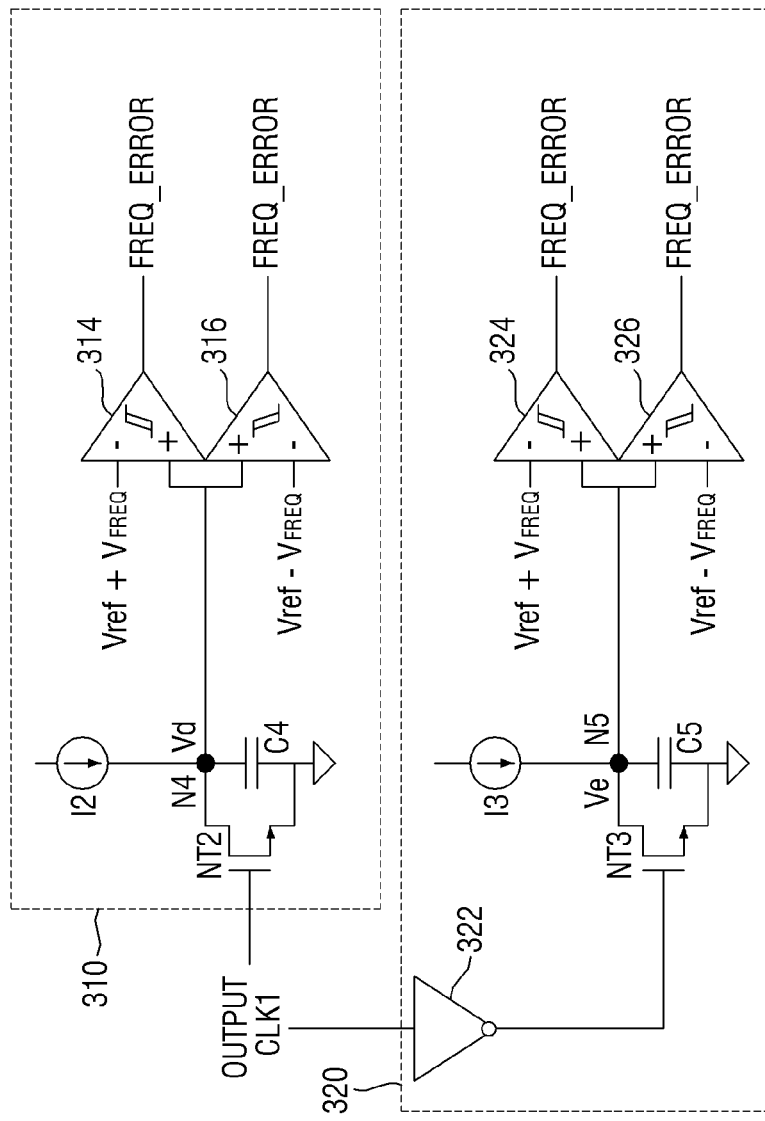
FIG. 11 is a block diagram for explaining a first circuit of FIG. 1.
Figure 14:
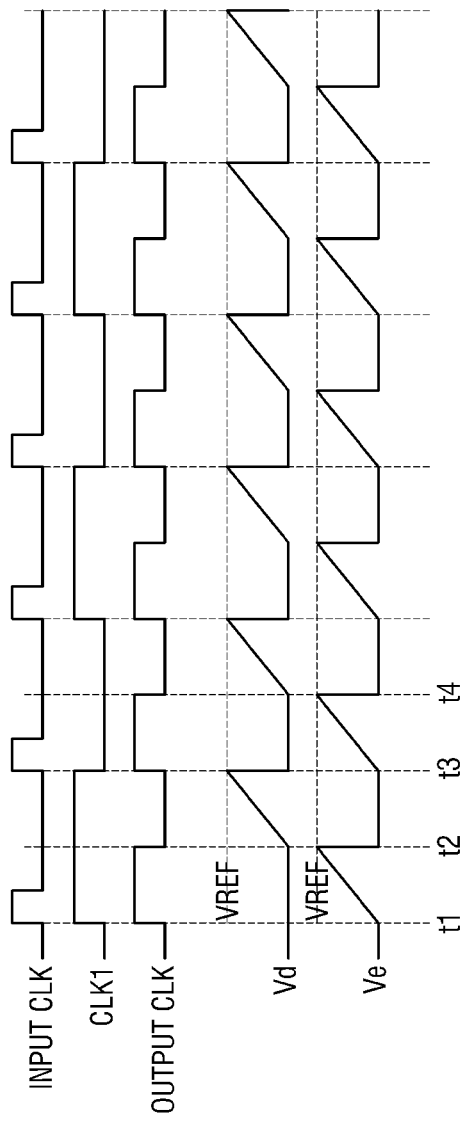
FIGS. 14 and 15 are timing diagrams for explaining the operation of the first to third circuits of FIGS. 11 to 13.
Figure 15:
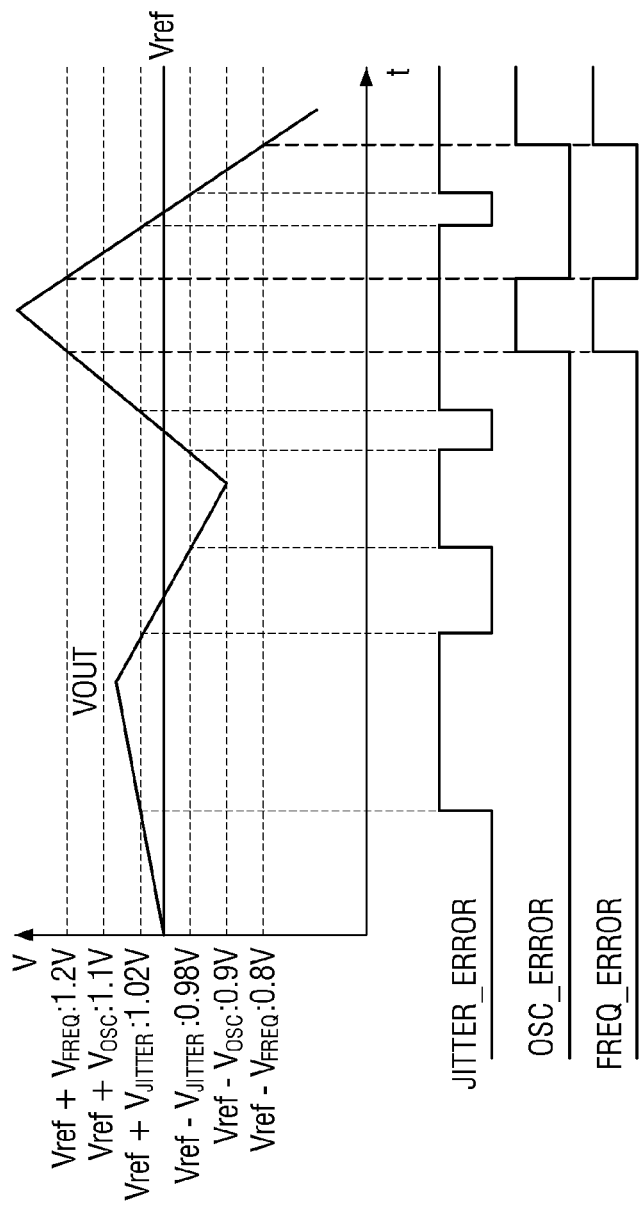

FIG. 11 is a block diagram for explaining the first circuit of FIG. 1. FIGS. 14 and 15 are timing diagrams for explaining the operation of the first to third circuits of FIGS. 11 to 13.

Referring to FIGS. 11, 14 and 15, the first circuit 302 may include a first sub-circuit 310 and a second sub-circuit 320.

The first sub-circuit 310 may generate a first output voltage according to the output clock OUTPUT CLK and provide the first output voltage to a fourth node N4. The second transistor NT2 is gated to the output clock OUTPUT CLK, and may be connected between the fourth node N4 and the ground node. The second transistor NT2 is turned on when the output clock OUTPUT CLK is at the first logic level, and may provide the ground voltage to the fourth node N4.

A fourth capacitor C4 may be connected in parallel with the second transistor NT2 between the fourth node N4 and the ground node. The fourth capacitor C4 is provided with the current from the second current source I2 when the second transistor NT2 is turned on, and may be charged with the voltage Vd of the fourth node N4. The fourth capacitor C4 may be discharged by the ground voltage when the second transistor NT2 is turned off.

The voltage Vd of the fourth node N4 may be a voltage integrated by the fourth capacitor C4. Therefore, the voltage Vd of the fourth node N4 may increase in a section in which the output clock OUTPUT CLK is at the second logic level, for example, between the second time point t2 and the third time point t3. That is, the voltage Vd of the fourth node N4 may be a voltage which is generated by the fourth capacitor C4 during a half or 0.5 cycle of the output clock OUTPUT CLK or in a section in which the output clock OUTPUT CLK is at the second logic level.

The voltage Vd of the fourth node N4 may change depending on an increase or a decrease in the frequency of the output clock OUTPUT CLK. In addition, even if the frequency of the output clock OUTPUT CLK is substantially the same, when a duty ratio of the output clock OUTPUT CLK changes, the voltage Vd of the fourth node N4 may vary accordingly.

A first sub-comparator 314 is provided with the first reference voltage (Vref+$V_{FREQ}$) and the voltage Vd of the fourth node N4, and may output the comparison result. The first sub-comparator 314 may output a first error signal FREQ_ERROR having a first logic level, when the voltage Vd of the fourth node N4 is higher than the first reference voltage (Vref+$V_{FREQ}$).

A second sub-comparator 316 is provided with the second reference voltage (Vref−$V_{FREQ}$) and the voltage Vd of the fourth node N4, and may output the comparison result. The second sub-comparator 316 may output a first error signal FREQ_ERROR having a first logic level, when the voltage Vd of the fourth node N4 is lower than the second reference voltage (Vref−$V_{FREQ}$).

A second sub-circuit 320 may further include an inverter 322 as compared to the first sub-circuit 330. The inverter 322 may invert the output clock OUTPUT CLK. The second sub-circuit 320 may generate a second output voltage according to the inverted first output clock and provide the second output voltage to the fifth node N5.

The voltage Ve of the fifth node N5 may be a voltage integrated by the fifth capacitor C5. The voltage Ve of the fifth node N5 may increase in a section in which the output clock OUTPUT CLK is at the first logic level, for example, between the first time point t1 and the second time point t2. The voltage Ve of the fifth node N5 may be a voltage generated by the fifth capacitor C5 in a section in which the inverted first output clock is at the first logic level. Alternatively, the voltage Ve of the fifth node N5 may be a voltage generated by the fifth capacitor C5 in a section in which the output clock OUTPUT CLK is at the second logic level.

Therefore, when the frequency of the output clock OUTPUT CLK increases or decrease, the voltage Ve of the fifth node N5 may change accordingly. In addition, even if the frequency of the output clock OUTPUT CLK is substantially the same, when the duty ratio of the output clock OUTPUT CLK changes, the voltage Ve of the fifth node N5 may vary accordingly.

A third sub-comparator 324 is provided with the first reference voltage (Vref+$V_{FREQ}$) and the voltage Ve of the fifth node N5, and may output the comparison result. The first sub-comparator 314 may output a first error signal FREQ_ERROR having a first logic level, when the voltage Ve of the fifth node N5 is higher than the first reference voltage (Vref+$V_{FREQ}$).

A fourth sub-comparator 326 is provided with the second reference voltage (Vref−$V_{FREQ}$) and the voltage Ve of the fifth node N5, and may output the comparison result. The fourth sub-comparator 326 may output a first error signal FREQ_ERROR having a first logic level, when the voltage Ve of the fifth node N5 is lower than the second reference voltage (Vref−$V_{FREQ}$).

The first circuit 302 according to an exemplary embodiment of the present inventive concept may detect an error of the output clock OUTPUT CLK by the first sub-circuit 310 in the section in which the output clock OUTPUT CLK is at the first logic level. Further, the first circuit 302 may detect an error of the output clock OUTPUT CLK by the second sub-circuit 320 in the section in which the output clock OUTPUT CLK is at the second logic level. That is, the first circuit 302 according to an exemplary embodiment of the present inventive concept may detect an error of the output clock OUTPUT CLK at the rising edge and the falling edge of the output clock OUTPUT CLK. Therefore, it is possible to more accurately detect an error of the output clock OUTPUT CLK. In addition, since an error of the output clock OUTPUT CLK is detected by converting the output clock OUTPUT CLK into a voltage in real time according to the output clock OUTPUT CLK, it is possible to more quickly detect an error of the output clock OUTPUT CLK.

Figure 12:
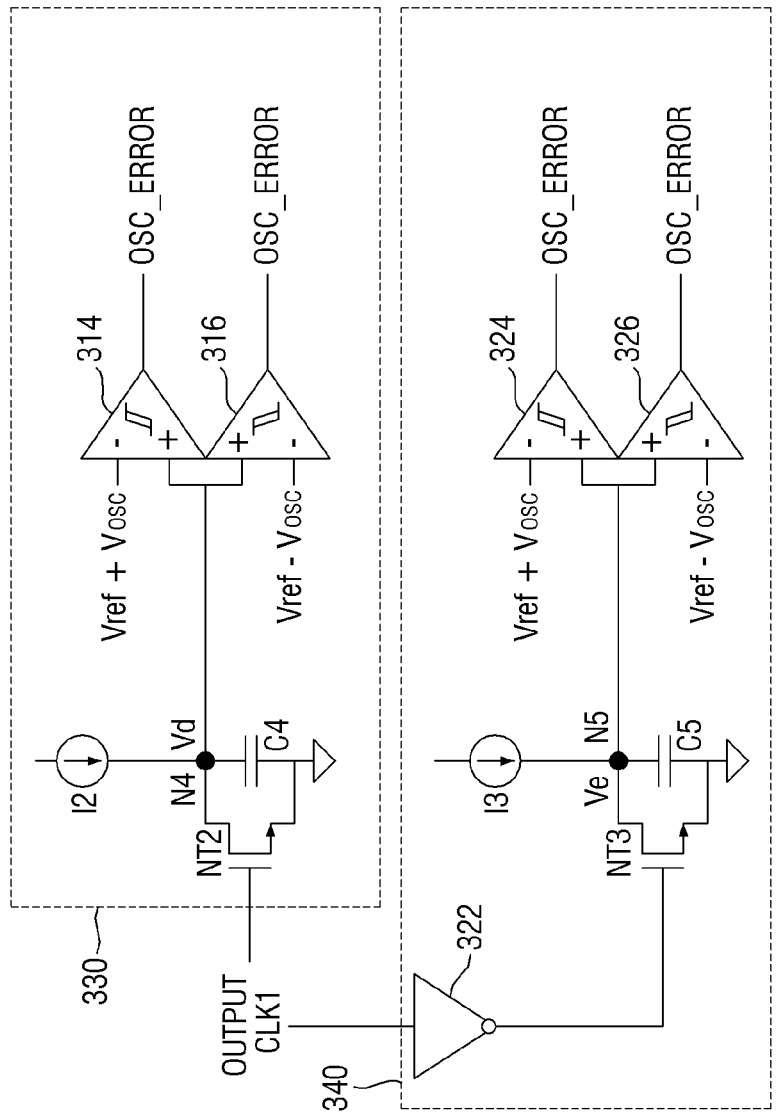
FIG. 12 is a block diagram for explaining a second circuit of FIG. 1.

FIG. 12 is a block diagram for explaining the second circuit of FIG. 1. Points different from FIG. 11 will be mainly explained, and substantially duplicate description may be omitted.

Referring to FIGS. 12, 14 and 15, the second circuit 304 may include a first sub-circuit 330 and a second sub-circuit 340. The first sub-circuit 330 is provided with the third reference voltage (Vref+$V_{OSC}$) and the voltage Vd of the fourth node N4, and may output a second error signal OSC_ERROR. The second sub-circuit 340 is provided with the fourth reference voltage (Vref−$V_{OSC}$) and the voltage Ve of the fifth node N5, and may output the second error signal OSC_ERROR.

Figure 13:
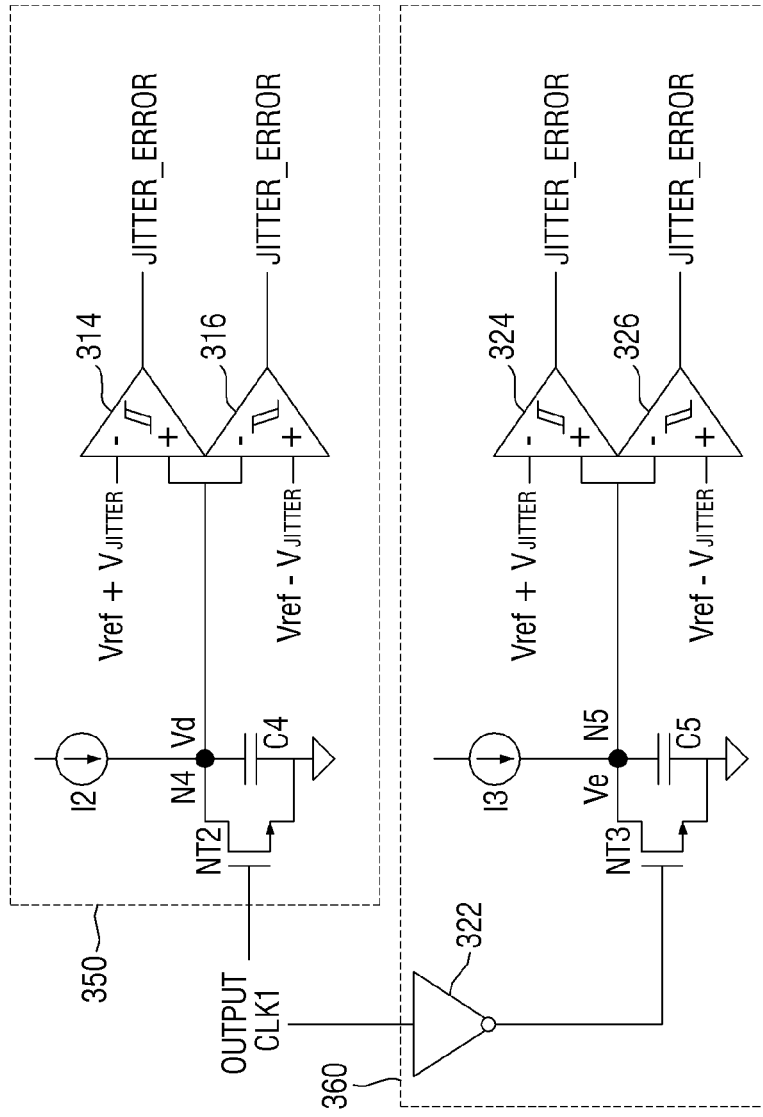
FIG. 13 is a block diagram for explaining a third circuit of FIG. 1.

FIG. 13 is a block diagram for explaining the third circuit of FIG. 1. Points different from FIG. 11 will be mainly explained, and substantially duplicate description may be omitted.

Referring to FIGS. 13, 14, and 15, the third circuit 306 may include a first sub-circuit 350 and a second sub-circuit 360. The first sub-circuit 350 is provided with the third reference voltage (Vref+$V_{OSC}$) and the voltage of the fourth node N4, and may output a third error signal JITTER_ERROR. The second sub-circuit 360 is provided with the fourth reference voltage (Vref−$V_{OSC}$) and the voltage of the sixth node N5, and may output the third error signal JITTER_ERROR.

Figure 16:
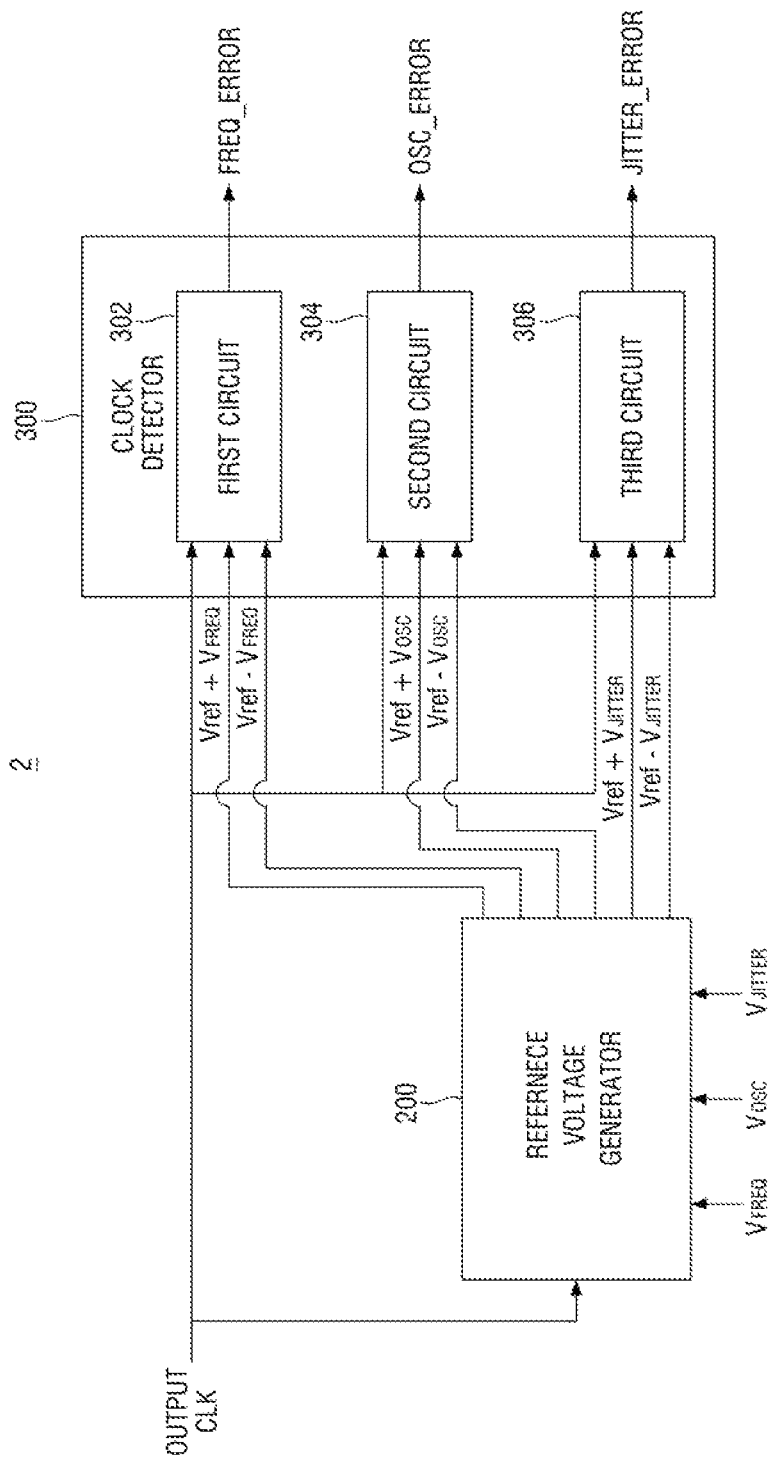
FIG. 16 is a block diagram for explaining a semiconductor device according to an exemplary embodiment of the present inventive concept.

FIG. 16 is a block diagram for explaining a semiconductor device according to an exemplary embodiment of the present inventive concept. Points different from FIG. 1 will be mainly explained, and substantially duplicate description may be omitted.

Referring to FIG. 16, a semiconductor device 2 according to an exemplary embodiment of the present inventive concept may include a reference voltage generator 200 and a clock detector 300.

The reference voltage generator 200 may be provided with an output clock OUTPUT CLK and a plurality of error voltages ($V_{FREQ}$, $V_{OSC}$, and $V_{JITTER}$). The reference voltage generator 200 may generate a sub-reference voltage Vref according to the frequency of the output clock OUTPUT CLK. Here, the output clock OUTPUT CLK may be a clock locked in accordance with the reference signal having a constant frequency.

The reference voltage generator 200 may generate a plurality of reference voltages (Vref±$V_{FREQ}$, Vref±$V_{OSC}$, and Vref±$V_{JITTER}$), using the sub-reference voltage Vref and the plurality of error voltages ($V_{FREQ}$, $V_{OSC}$, and $V_{JITTER}$).

The clock detector 300 is provided with the output clock OUTPUT CLK and may generate an output voltage. The clock detector 300 may be provided with the plurality of reference voltages (Vref±$V_{FREQ}$, Vref±$V_{OSC}$, and Vref±$V_{JITTER}$) from the reference voltage generator 200. The clock detector 300 may compare the first output voltage with the plurality of reference voltages (Vref±$V_{FREQ}$, Vref±$V_{OSC}$, and Vref $V_{JITTER}$) to output a plurality of error signals (FREQ_ERROR, OSC_ERROR, and JITTER_ERROR).

The semiconductor device 2 according to an exemplary embodiment of the present inventive concept may detect an error of a frequency range of the output clock OUTPUT CLK, an error of jitter, and an error of oscillation, using only one output clock OUTPUT CLK.

Figure 17:
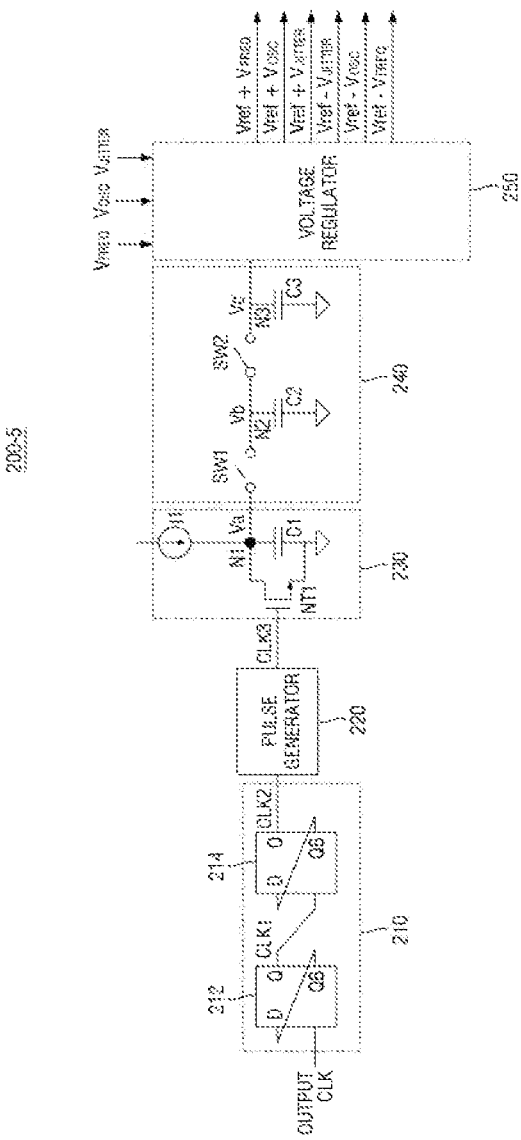
FIG. 17 is a block diagram for explaining the reference voltage generator of FIG. 16.

FIG. 17 is a diagram for explaining the reference voltage generator of FIG. 16. FIG. 4 is a timing diagram for explaining the operation of the reference voltage generator of FIG. 17. Points different from FIG. 3 will be mainly explained, and substantially duplicate description may be omitted.

Referring to FIGS. 4 and 17, a reference voltage generator 200-5 is provided with an output clock OUTPUT CLK and may generate a plurality of error voltages ($V_{FREQ}$, $V_{OSC}$, and $V_{JITTER}$).

The divider circuit 210 may be provided with the output clock OUTPUT CLK. The divider circuit 210 may divide the output clock OUTPUT CLK by 4 to generate a second clock CLK2.

The reference voltage generator 200-5 may generate a plurality of reference voltages (Vref±$V_{FREQ}$, Vref±$V_{OSC}$, and Vref±$V_{JITTER}$) according to the second clock CLK2 as described above in FIG. 3.

Figure 18:
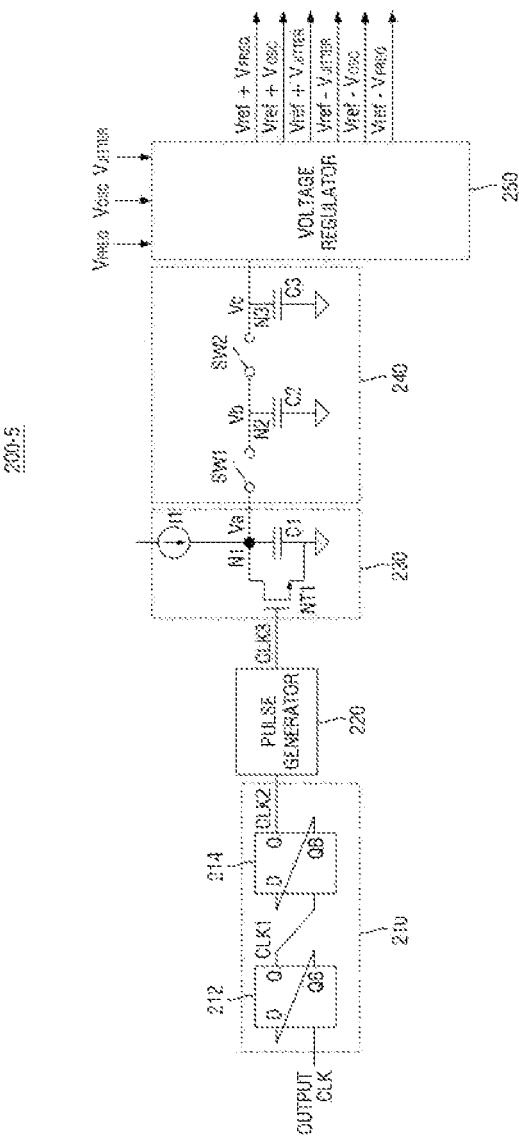
FIG. 18 is a block diagram for explaining the reference voltage generator according to an exemplary embodiment of the present inventive concept of FIG. 16.

FIG. 18 is a block diagram for explaining a reference voltage generator according to an exemplary embodiment of the present inventive concept of FIG. 16. FIG. 6 is a timing diagram for explaining the operation of the reference voltage generator of FIG. 18. Points different from FIGS. 5 and 17 will be mainly explained, and substantially duplicate description may be omitted.

A reference voltage generator 200-6 may further include a pulse generator 220. The pulse generator 220 may generate a pulse in response to the rising edge and the falling edge of the second clock CLK2, and output the pulse to the third clock CLK3.

The reference voltage generator 200-6 may generate a plurality of reference voltages (Vref±$V_{FREQ}$, Vref±$V_{OSC}$, and Vref±$V_{JITTER}$) in accordance with the second clock CLK2 as described above in FIG. 5.

Figure 19:
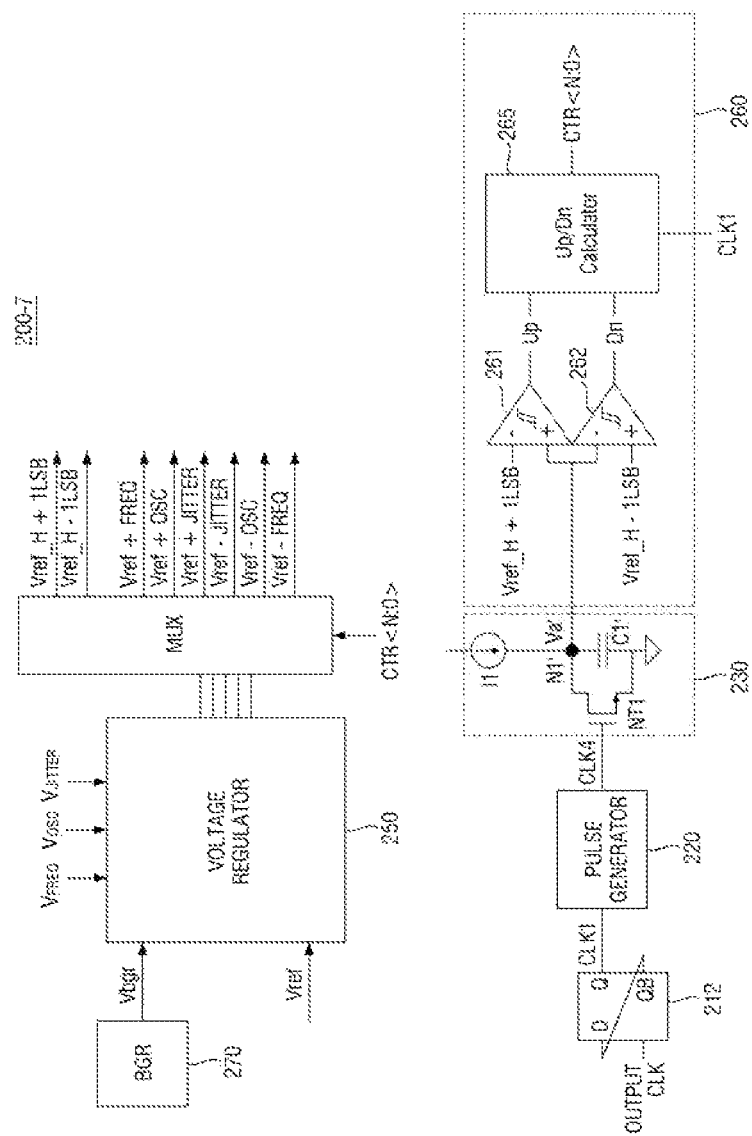
FIG. 19 is a block diagram for explaining the reference voltage generator according to an exemplary embodiment of the present inventive concept of FIG. 16.

FIG. 19 is a block diagram for explaining a reference voltage generator according to an exemplary embodiment of the present inventive concept of FIG. 16. FIG. 8 is a timing diagram for explaining the operation of the reference voltage generator of FIG. 19. Points different from FIGS. 7 and 18 will be mainly explained, and substantially duplicate description may be omitted.

Referring to FIGS. 8 and 19, the first flip-flop 212 may divide the output clock OUTPUT CLK by 2 to generate the first clock CLK1.

The pulse generator 220 may generate a pulse in response to the rising edge and the falling edge of the first clock CLK1 and output the pulse to the fourth clock CLK4.

A reference voltage generator 200-7 may generate a plurality of reference voltages (Vref±$V_{FREQ}$, Vref±$V_{OSC}$, and Vref±$V_{JITTER}$) in accordance with the fourth clock CLK4.

Figure 20:
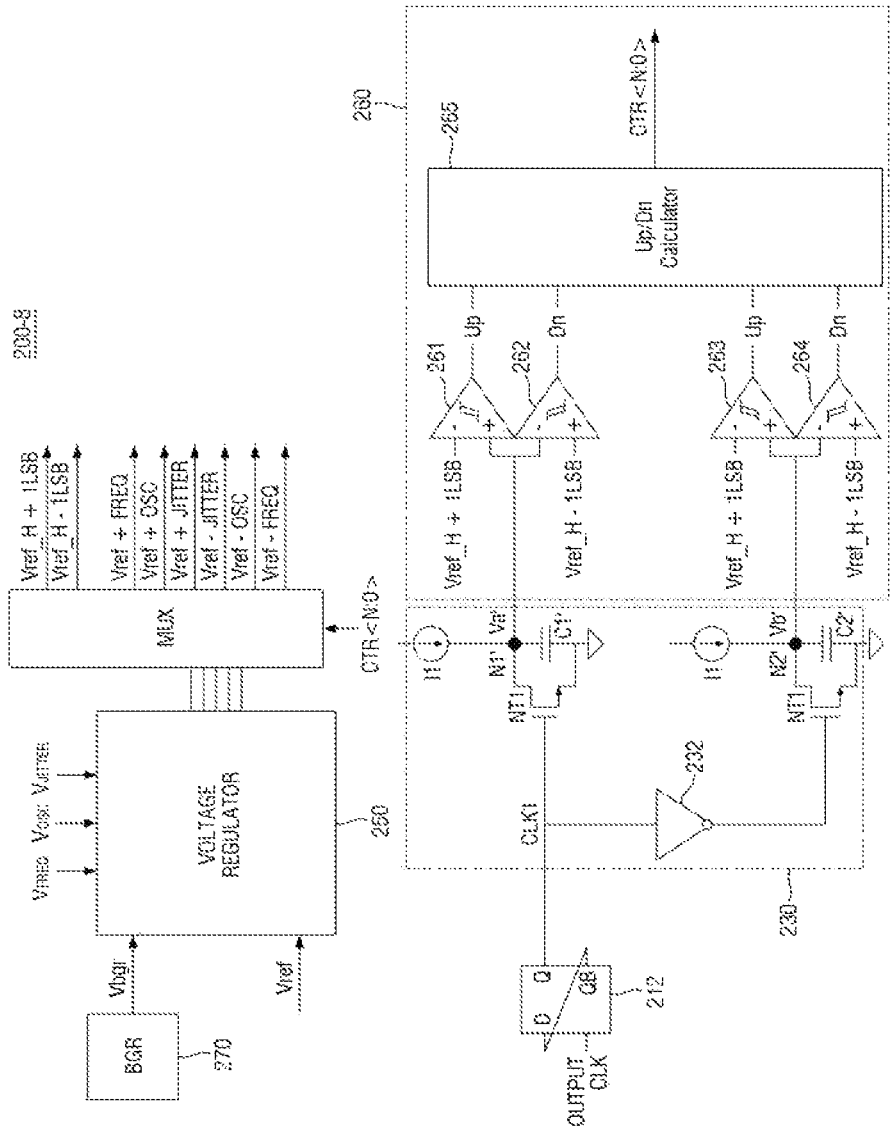
FIG. 20 is a block diagram for explaining the reference voltage generator according to an exemplary embodiment of the present inventive concept of FIG. 16.

FIG. 20 is a block diagram for explaining a reference voltage generator according to an exemplary embodiment of the present inventive concept of FIG. 16. FIG. 10 is a timing diagram for explaining the operation of the reference voltage generator of FIG. 19. Points different from FIGS. 9 and 19 will be mainly explained, and substantially duplicate description may be omitted.

Referring to FIGS. 10 and 20, the voltage conversion circuit 230 may generate a second sub-reference voltage Vref_H by the first clock CLK1 and the first clock inverted by the inverter 232. A control signal generation circuit 260 may generate a control signal CTR<N:0>, using the second sub-reference voltage Vref_H and the first and second control voltages (Vref_H±1LSB).

A reference voltage generator 200-8 is provided with the bandgap reference voltage Vbgr and the first to third error voltages ($V_{FREQ}$, $V_{OSC}$, and $V_{JITTER}$), generates the output voltage, and may output the first to sixth reference voltages (Vref±$V_{FREQ}$, Vref±$V_{OSC}$, and Vref±$V_{JITTER}$) according to the resistor connected to the multiplexer MUX by the control signal CTR<N:0>.

Figure 21:
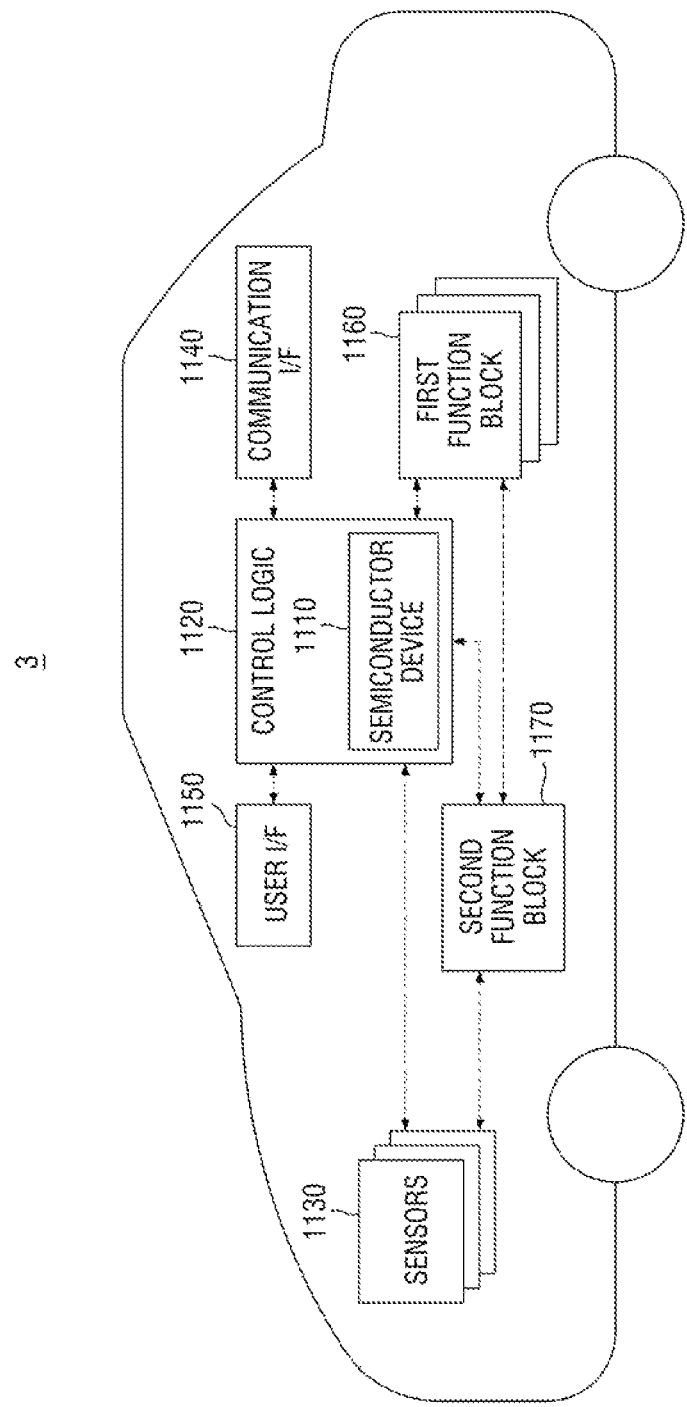
FIG. 21 is a block diagram for explaining a semiconductor system according to an exemplary embodiment of the present inventive concept.

FIG. 21 is a diagram for explaining a semiconductor system according to an exemplary embodiment of the present inventive concept.

Referring to FIG. 21, a semiconductor system 3 according to an exemplary embodiment of the present inventive concept may be a vehicle, such as an automobile, aircraft or other conveyance. The semiconductor system 3 may include control logic 1120, a semiconductor device 1110, one or more sensors 1130, a communications interface 1140, a user interface 1150, a first function block 1160, and a second function block 1170.

The semiconductor device 1110 may operate on the basis of the embodiments explained using FIGS. 1 to 20. The control logic 1120 may output the first to third error signals that are output from the semiconductor device 1110. The control logic 1120 may output the output clock generated by the semiconductor device 1110 to a system clock of the vehicle, on the basis of the first to third error signals output from the semiconductor device 1110.

The sensor 1130 may include active scanning devices such as one or more camera device, one or more LiDAR sensors, and one or more ultrasonic sensors, one or more geospatial positioning devices and the like. The sensor 1130 may generate a sensing signal by monitoring at least a part of the external environment surrounding the vehicle.

The communications interface 1140 may include a wireless transceiver and/or a GPS (Global Positioning System).

The user interface 1150 may include a display circuit indicating an instrument panel of the vehicle, or the like. The display circuit may display first to third error signals provided from the control logic 1120, and may notify the user of them.

The first function block 1160 may perform a first process, using the output clock provided from the control logic 1120. The second function block 1170 may perform a second process, using the output clock provided from the control logic 1120. The first process and the second process may be different from each other. The first process and the second process may mean, for example, operations of a vehicle steering device configured to control directions of the vehicle, a throttle device configured to control acceleration and/or deceleration by controlling a motor or an engine of the vehicle, a braking device configured to control the braking of the vehicle, an external lighting device, or the like.

As a result, since the semiconductor system 3 according to an exemplary embodiment of the present inventive concept may quickly detect an error of the output clock, the safety of the vehicle can be further improved. Further, since the semiconductor system 3 according to an exemplary embodiment of the present inventive concept may detect the first to third error signals of the output clock, it can be used for determining whether to satisfy an ASIL (Automotive Safety Integrity Level) required in an electric industry.

Figure 22:
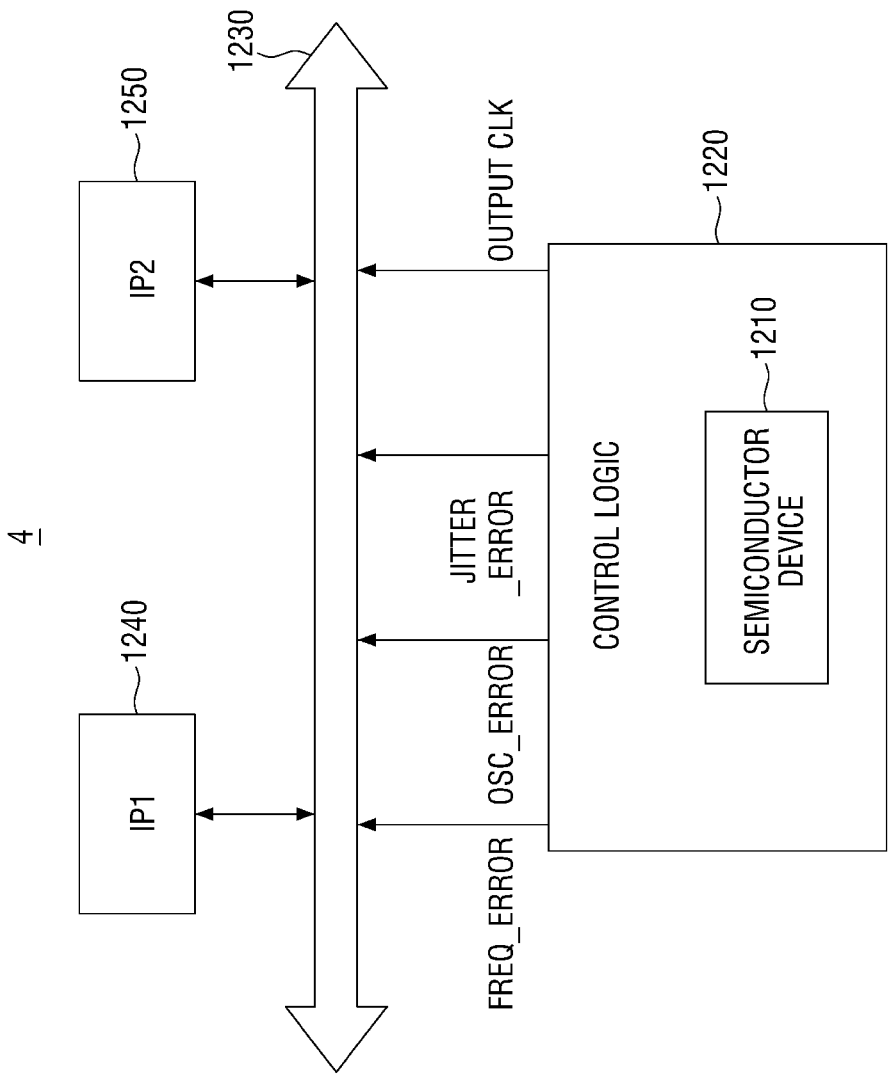
FIG. 22 is a block diagram for explaining the semiconductor system according to an exemplary embodiment of the present inventive concept.

FIG. 22 is a diagram for explaining a semiconductor system according to an exemplary embodiment of the present inventive concept.

Referring to FIG. 22, a semiconductor system 4 according to an exemplary embodiment of the present inventive concept may include a semiconductor device 1210, control logic 1220, and one or more IP (Intellectual Property) blocks 1240 and 1250. The semiconductor device 1210 may operate on the basis of the embodiments explained through FIGS. 1 to 20. The control logic 1220 may provide first to third error signals (FREQ_ERROR, OSC_ERROR, and JITTER_ERROR) and/or an output clock OUTPUT CLK, which are output from the semiconductor device 1210, to one or more IP blocks 1240 and 1250 through a bus 1230.

In this embodiment, the semiconductor system 4 may be an application processor (AP). Further, one or more IP blocks 1240 and 1250 may correspond to modules having various functions mounted inside the application processor. One or more IP blocks 1240 and 1250 may be driven by the output clock OUTPUT CLK. Alternatively, the semiconductor system 4 may output the first to third error signals (FREQ_ERROR, OSC_ERROR, and JITTER_ERROR), and may generate another control signal, using the first to third error signals (FREQ_ERROR, OSC_ERROR, JITTER_ERROR).

Figure 23:
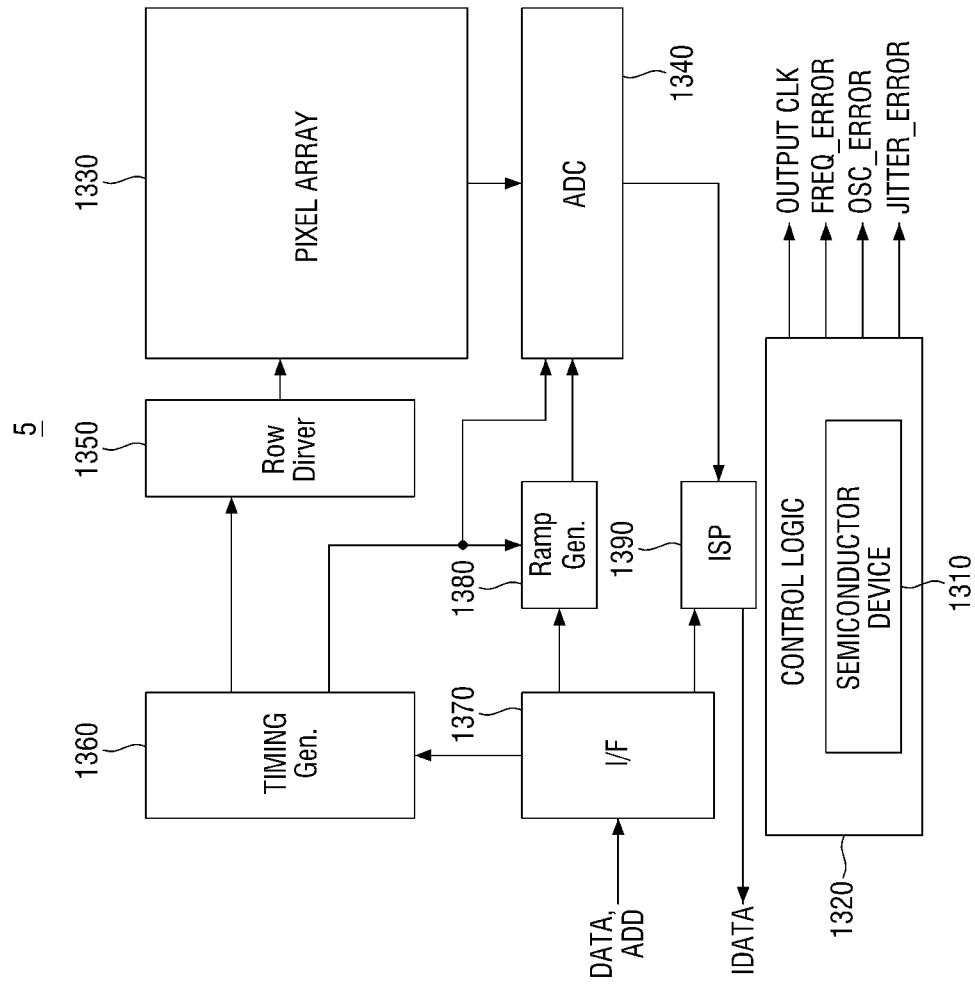
FIG. 23 is a block diagram for explaining a semiconductor system according to exemplary embodiment of the present inventive concept.

FIG. 23 is a diagram for explaining a semiconductor system according to an exemplary embodiment of the present inventive concept.

Referring to FIG. 23, a semiconductor system 5 according to an exemplary embodiment of the present inventive concept may be an image sensor. The semiconductor system 5 may include a semiconductor device 1310, control logic 1320, a pixel array 1330, an analog-digital conversion circuit 1340, a row driver 1350, a timing generator 1360, an interface circuit 1370, a ramp signal generator 1380, and an image signal processing circuit 1390.

The semiconductor device 1310 may operate on the basis of the embodiments explained through FIGS. 1 to 20. The control logic 1320 may output the first to third error signals (FREQ_ERROR, OSC_ERROR, and JITTER_ERROR) and/or the output clock OUTPUT CLK output from the semiconductor device 1310.

The pixel array 1330, the analog-to-digital conversion circuit 1340, the row driver 1350, the timing generator 1360, the interface circuit 1370, the ramp signal generator 1380, and the image signal processor circuit 1390 may be driven on the basis of the output clock OUTPUT CLK. Further, the interface circuit 1370 may output first to third error signals (FREQ_ERROR, OSC_ERROR, and JITTER_ERROR). Alternatively, the semiconductor system 5 may generate another control signal, using the first to third error signals (FREQ_ERROR, OSC_ERROR, and JITTER_ERROR).

The pixel array 1330 may include a number of pixels arranged in a matrix form. The row driver 1350 may drive a number of control signals for controlling the operation of each of the plurality of pixels to the pixel array 1330, under the control of the timing generator 1360. The timing generator 1360 may control the operations of the analog-to-digital conversion circuit 1340, the row driver 1350, the ramp signal generator 1380, and the image signal processing circuit 1390. The image signal processing circuit 1390 may perform image processing such as color correction on raw data output from the analog-to-digital conversion circuit 1340 to generate image data IDATA. The image data IDATA may be output to an external device. The interface circuit 1370 receives data DATA and an address signal ADD indicating a register in which the data DATA is stored from an external device, and may transmit the data DATA to a register indicated by the address signal ADD.

In concluding the detailed description, those of ordinary skill in the pertinent art will appreciate that many variations and modifications may be made to the preferred embodiments without substantially departing from the principles of the present inventive concept. Therefore, the disclosed preferred embodiments of the inventive concept are used in a generic and descriptive sense, only, and not for purposes of limitation.

What is claimed is:

1. A semiconductor device comprising:
a clock generator configured to receive an input clock and generate an output clock;
a reference voltage generator configured to receive the input clock or the output clock, generate a sub-reference voltage in accordance with a frequency of the input clock or a frequency of the output clock, respectively, and generate a reference voltage using the sub-reference voltage and a preset error voltage; and
a clock detector configured to receive the output clock, generate a first output voltage in accordance with the output clock, and compare the generated first output voltage with the reference voltage to output an error signal based on the output clock,
wherein the preset error voltage is set in accordance with a degree of preset error of the output clock.

2. The semiconductor device of claim 1, wherein the clock generator includes a PLL configured to receive a reference clock and generate the output clock from the input clock using the reference clock.

3. The semiconductor device of claim 1, wherein the reference voltage generator includes:
a divider circuit which divides the input clock or the output clock by 2 to generate a first clock, and divides the first clock by 2 to generate a second clock;
a voltage conversion circuit which generates a first voltage in accordance with the second clock using a first current, and
a sample-and-hold circuit which samples the first voltage to generate the sub-reference voltage.

4. The semiconductor device of claim 3, wherein the voltage conversion circuit generates the first voltage when the second clock is at a first logic level, and the voltage conversion circuit maintains the first voltage when the second clock is at a second logic level.

5. The semiconductor device of claim 3, wherein:
the reference voltage generator further includes a pulse generator which generates a pulse at a rising edge and a falling edge of the second clock, and
the voltage conversion circuit resets the first voltage to a ground voltage in accordance with the pulse.

6. The semiconductor device of claim 5, wherein the sub-reference voltage is an average voltage of the first voltage.

7. The semiconductor device of claim 5, wherein the sample-and-hold circuit samples the first voltage during a half cycle of the first clock to generate a second voltage, and samples the second voltage in accordance with the pulse to generate the sub-reference voltage.

8. The semiconductor device of claim 1, wherein the reference voltage generator includes:
a divider circuit which divides the input clock or the output clock by 2 to generate a first clock,
a pulse generation circuit which generates a pulse at a rising edge and a falling edge of the first clock,
a voltage conversion circuit which generates a second voltage in accordance with the pulse using a second current, and a voltage regulator which generates the reference voltage having a difference between the second voltage and the preset error voltage,
wherein the sub-reference voltage is twice a maximum value of the second voltage.

9. The semiconductor device of claim 8, wherein:
the reference voltage generator further includes a bandgap reference voltage generation circuit which generates a bandgap reference voltage,
the voltage regulator generates the reference voltage using the bandgap reference voltage and a resistor connected by a control signal.

10. The semiconductor device of claim 9, further comprising:
a control signal generation circuit which is connected to the output of the voltage conversion circuit, and compares a control voltage having a voltage difference proportional to the second voltage and the connected resistor with the second voltage to output the control signal.

11. The semiconductor device of claim 1, wherein:
the preset error voltage includes a first error voltage indicating a frequency error of the output clock, a second error voltage indicating an oscillation error of the output clock, and a third error voltage indicating a jitter error of the output clock, and
a magnitude of the first error voltage is greater than a magnitude of the second error voltage, and the magnitude of the second error voltage is greater than a magnitude of the third error voltage.

12. The semiconductor device of claim 1, wherein:
the clock detector inverts the output clock and further generates a second output voltage in accordance with the inverted output clock, and
the clock detector compares the second output voltage with the reference voltage to output the error signal.

13. A semiconductor device comprising:
a clock generator configured to receive an input clock and generate an output clock;
a divider circuit which divides the input clock or the output clock to generate a first clock, and divides the first clock to generate a second clock;
a first capacitor connected to a first current source and charged with a first voltage in accordance with the second clock;
a sample-and-hold circuit which samples the first voltage to output a second voltage which is an average voltage of the first voltage;
a voltage regulator which generates a reference voltage having a difference between the second voltage and a preset error voltage;
a second capacitor connected to a second current source and charged with a third voltage in accordance with the output clock; and
a clock detector which compares the third voltage with the reference voltage to output an error signal based on the output clock.

14. The semiconductor device of claim 13, further comprising:
a first pulse generator which is connected to the divider circuit and the first capacitor, and generates a first pulse signal in response to a rising edge and a falling edge of the second clock; and
a transistor gated to the first pulse signal and connected in parallel with the first capacitor.

15. The semiconductor device of claim 13, wherein:
a capacitance of the first capacitor is twice a capacitance of the second capacitor, and
a magnitude of a first current provided from the first current source is substantially the same as a magnitude of a second current provided from the second current source.

16. The semiconductor device of claim 13, further comprising;
an inverter which inverts the output clock; and
a third capacitor connected to the second current source and charged with a third voltage in accordance with the inverted output clock,
wherein the clock detector compares the third voltage and the reference voltage to output an error signal based on the output clock, and
capacitance of the third capacitor is substantially the same as capacitance of the second capacitor.

17. The semiconductor device of claim 13, further comprising:
a second pulse generator which generates a second pulse signal prior to a rising edge and a falling edge of the second clock,
wherein the sample-and-hold circuit includes a fourth capacitor connected in parallel with the first capacitor by a first switch switched by the first clock, and a fifth capacitor connected in parallel with the fourth capacitor by a second switch switched by the second pulse signal.

18. The semiconductor device of claim 13, further comprising:
a transistor gated to the second clock and connected in parallel with the first capacitor when the second clock is at a first logic level,
wherein when the first clock is at a second logic level and the second clock is at the first logic level, the sample-and-hold circuit samples the first voltage and outputs the second voltage.

19. The semiconductor device of claim 13, wherein a difference of the preset error voltage includes differences in first to third error voltages,
the reference voltage includes first to third reference voltages each having the second voltage and the difference in the first to third error voltages,
the error signal includes first to third error signals,
the clock detector compares the second voltage with the first reference voltage to output the first error signal, and compares the second voltage with the second reference voltage to output the second error signal, and compares the second voltage with the third reference voltage to output the third error signal.

20. A semiconductor system comprising:
a semiconductor device configured to receive a reference clock and an input clock, output an output clock generated from the input clock using the reference clock, and output an error signal based on the output clock;
a display circuit configured to receive the error signal and display the error signal;
control logic configured to receive the output clock and the error signal, output the output clock when the error signal is at a first logic level, and not output the output clock when the error signal is at a second logic level;
a first function block configured to receive the output clock from the control logic and execute a first process; and a second function block configured to receive the output clock from the control logic and execute a second process different from the first process,
wherein the semiconductor device includes:
   a reference voltage generator configured to receive the input clock or the output clock, generate a sub-reference voltage in accordance with a frequency of the input clock or a frequency of the output clock, respectively, and generate a reference voltage using the sub-reference voltage and a preset error voltage, and
   a clock detector configured to receive the output clock, generate an output voltage in accordance with the output clock, and compare the generated output voltage with the reference voltage to output an error signal based on the output clock.

* * * * *